US011087221B2

(12) United States Patent
Al-Harbi et al.

(10) Patent No.: US 11,087,221 B2
(45) Date of Patent: Aug. 10, 2021

(54) WELL PERFORMANCE CLASSIFICATION USING ARTIFICIAL INTELLIGENCE AND PATTERN RECOGNITION

(71) Applicant: Saudi Arabian Oil Company, Dhahran (SA)

(72) Inventors: Badr M. Al-Harbi, Dhahran (SA); Amell Ali Al-Ghamdi, Dammam (SA); Ali A. Al-Turki, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 746 days.

(21) Appl. No.: 15/437,170

(22) Filed: Feb. 20, 2017

(65) Prior Publication Data
US 2018/0240021 A1  Aug. 23, 2018

(51) Int. Cl.
*G06N 5/04* (2006.01)
*E21B 41/00* (2006.01)
(Continued)

(52) U.S. Cl.
CPC .......... *G06N 5/04* (2013.01); *E21B 41/0092* (2013.01); *E21B 43/00* (2013.01); *E21B 44/00* (2013.01);
(Continued)

(58) Field of Classification Search
CPC ...... E21B 41/0092; E21B 43/00; E21B 44/00; E21B 49/00; G06F 17/5009; G06F 30/20; G06N 5/04; G06N 3/08; G06N 7/005
See application file for complete search history.

(56) References Cited

U.S. PATENT DOCUMENTS 6,415,864 B1 * 7/2002 Ramakrishnan ...... E21B 47/047
166/250.03
10,138,717 B1 * 11/2018 Ludwig ................... E21B 43/00
(Continued)

FOREIGN PATENT DOCUMENTS

WO    2014160348    10/2014

OTHER PUBLICATIONS

Zhakiya, "Using Machine Learning for Hydrocarbon Prospecting in Reconcavo Basin, Brazil," bachelor's thesis, Mass. Institute of Tech. (2016). (Year: 2016).*
(Continued)

*Primary Examiner* — Kamran Afshar
*Assistant Examiner* — Ryan C Vaughn
(74) *Attorney, Agent, or Firm* — Bracewell LLP; Constance G. Rhebergen; Christopher L. Drymalla

(57) ABSTRACT

A heterogeneous classifier based on actual reservoir and well data is developed to qualitatively classify oil well producer performance. Based on the classification a new well is drilled into a producing reservoir, or fluid flows in an existing well are adjusted. The data include perforation interval(s), completion type, and how far or close the perforated zones are located relative to the free water level or gas cap. The data also include geological data, such as major geological bodies like regional faults and fractures. The features may be prioritized before classification. The classifier utilizes four different techniques to apply pattern recognition on reservoir simulation vector data to classify the wells, Three of the classification techniques are supervised learning methods: Bayesian classification, dynamic time warping and neural network. The fourth classification is an unsupervised method, clustering, to automate well grouping into similar categories.

18 Claims, 16 Drawing Sheets

(51) Int. Cl.
*E21B 49/00* (2006.01)
*G06N 3/08* (2006.01)
*G06N 7/00* (2006.01)
*E21B 43/00* (2006.01)
*G06F 30/20* (2020.01)
*E21B 44/00* (2006.01)

(52) U.S. Cl.
CPC .............. *E21B 49/00* (2013.01); *G06F 30/20* (2020.01); *G06N 3/08* (2013.01); *G06N 7/005* (2013.01)

(56) References Cited

U.S. PATENT DOCUMENTS

| | | | |
|---|---|---|---|
| 2006/0241867 A1 | 10/2006 | Kuchuk | |
| 2008/0082469 A1* | 4/2008 | Wilkinson | E21B 43/00 706/13 |
| 2009/0084545 A1* | 4/2009 | Banerjee | E21B 43/00 166/250.15 |
| 2010/0088082 A1 | 4/2010 | Ingham et al. | |
| 2010/0114528 A1 | 5/2010 | Schipperijn et al. | |
| 2010/0161300 A1* | 6/2010 | Yeten | E21B 43/00 703/10 |
| 2010/0174489 A1 | 7/2010 | Bryant et al. | |
| 2010/0191516 A1 | 7/2010 | Benish et al. | |
| 2011/0011595 A1 | 1/2011 | Huang et al. | |
| 2013/0124171 A1 | 5/2013 | Schuette et al. | |
| 2013/0262069 A1* | 10/2013 | Leonard | E21B 43/00 703/10 |
| 2013/0346040 A1* | 12/2013 | Morales German | G06F 17/5009 703/2 |
| 2014/0116776 A1* | 5/2014 | Marx | E21B 44/00 175/24 |
| 2014/0136165 A1* | 5/2014 | Sarma | G06N 7/005 703/2 |
| 2014/0365409 A1 | 12/2014 | Burch et al. | |
| 2014/0379317 A1* | 12/2014 | Sanden | G01V 99/005 703/10 |
| 2015/0039544 A1* | 2/2015 | Gupta | G06N 3/02 706/21 |
| 2016/0004800 A1 | 1/2016 | Singh et al. | |
| 2016/0196367 A1* | 7/2016 | Petukhov | G06F 17/10 703/2 |
| 2016/0356125 A1 | 12/2016 | Bello et al. | |
| 2019/0003297 A1* | 1/2019 | Brannigan | E21B 7/00 |
| 2020/0080403 A1* | 3/2020 | Filippov | C09K 8/62 |

OTHER PUBLICATIONS

Esmaili et al., "Modeling and History Matching of Hydrocarbon Production from Marcellus Shale using Data Mining and Pattern Recognition Technologies," in SPE Eastern Regional Meeting, Society of Petroleum Engineers (2012). (Year: 2012).*
A Next-Generation Parallel Reservoir Simulator for Giant Reservoirs; 2009 SPE Reservoir Simulation Symposium, The Woodlands, TX, Feb. 2009, Dogru, et al.
International Search Report and Written Opinion dated Jun. 13, 2018 for corresponding PCT/US2018/018098.

* cited by examiner

WELL PERFORMANCE CLASSIFICATION USING ARTIFICIAL INTELLIGENCE AND PATTERN RECOGNITION

BACKGROUND OF THE INVENTION

1. Field of the Invention

The present invention relates to classifying the performance of production from wells based on well properties, geology, and fluid flow.

2. Description of the Related Art

Currently, planning new wells is done with analytical models which estimate well production/injection allocation based on reservoir energy (average reservoir pressure maps) and saturation. The well planning is done for horizontal, multilateral, and deviated wells and for more conventional vertical wells. However, well planning becomes very complex for large reservoirs or complex geology, particularly in situations where there is no analytical model that can accurately predict well performance. In such cases, well allocation can only be estimated from nearby wells. Numerical reservoir simulation is used to optimize the well design and the expected well performance. However, this technique has required very large numbers of computerized reservoir simulation runs that are both time consuming and computer resource intensive.

The prior art is a deterministic approach which uses as inputs well parameters originated by a stochastic combination generator based on pre-defined well plans. In addition, the prior art measured the performance of the well using economic analysis of the well that required development of economic risk assessment as part of the input parameters. The prior art methods were also deterministic in that fixed values of reservoir production were calculated.

SUMMARY OF THE INVENTION

Briefly, the present invention provides a new and improved method of forming a well in a producing hydrocarbon reservoir based on estimated well performance of a target well, the estimated well performance being determined based on estimated well production rates, and reservoir geological properties. Proposed well performance parameters of the target well are received for processing in a data processing system. The proposed well performance parameters include target well production rates and a proposed configuration and location of the well in the reservoir. A classification model of the target well is formed in the data processing system by processing the reservoir simulation results, the classification model indicating fluid production rates, flows and pressures in the producing hydrocarbon reservoir. A probabilistic estimate of production rates of the target well is formed in the data processing system based on the formed classification model, and the proposed configuration and location of the target well in the reservoir. If the estimate of production rates of the target well is acceptable, the target well is then formed in the producing hydrocarbon reservoir.

The present invention also provides a data processing system forming a measure of estimated well performance of a target well in a producing hydrocarbon reservoir, based on estimated well production rates, reservoir geological properties and computerized reservoir simulation results for the target well. The data processing system includes a processor which receives proposed well performance parameters of the target well for processing. The proposed well performance parameters include target well production rates and a proposed configuration and location of the well in the reservoir. The processor forms a classification model of the target well by processing the reservoir simulation results, the classification model indicating fluid production rates, flows and pressures in the producing hydrocarbon reservoir. The processor then forms a probabilistic estimate of production rates of the target well based on the formed classification model, and the proposed configuration and location of the target well in the reservoir. The data processing system further includes an output display indicating if the estimate of production rates of the target well is acceptable for forming the target well in the producing hydrocarbon reservoir.

The present invention also provides a data storage device which has stored in a non-transitory computer readable medium computer operable instructions for causing a data processing system to form a measure of estimated well performance of a target well in a producing hydrocarbon reservoir, based on estimated well production rates, reservoir geological properties and computerized reservoir simulation results for the target well. The stored instructions cause the data processing system to receive proposed well performance parameters of the target well for processing, and the proposed well performance parameters include target well production rates and a proposed configuration and location of the well in the reservoir. The instructions also cause the processor to form a classification model of the target well by processing the reservoir simulation results, the classification model indicating fluid production rates, flows and pressures in the producing hydrocarbon reservoir. The instructions also cause the processor to form a probabilistic estimate of production rates of the target well based on the formed classification model, and the proposed configuration and location of the target well in the reservoir, and cause an output display to be formed indicating if the estimate of production rates of the target well is acceptable for forming the target well in the producing hydrocarbon reservoir.

DETAILED DESCRIPTION OF THE PREFERRED EMBODIMENTS

For the recovery of oil and gas from subterranean reservoirs, wellbores are drilled into these formations for the recovery of hydrocarbon fluid. At times during the production life of such a reservoir, it is necessary to plan for additional wells for the reservoir and assess the potential effects on the reservoir of adjustments to either production or injection of the existing wells in the reservoir. In such situations, it is necessary to classify the performance of production from wells based on well properties, geology, and fluid flow.

Figure 1:
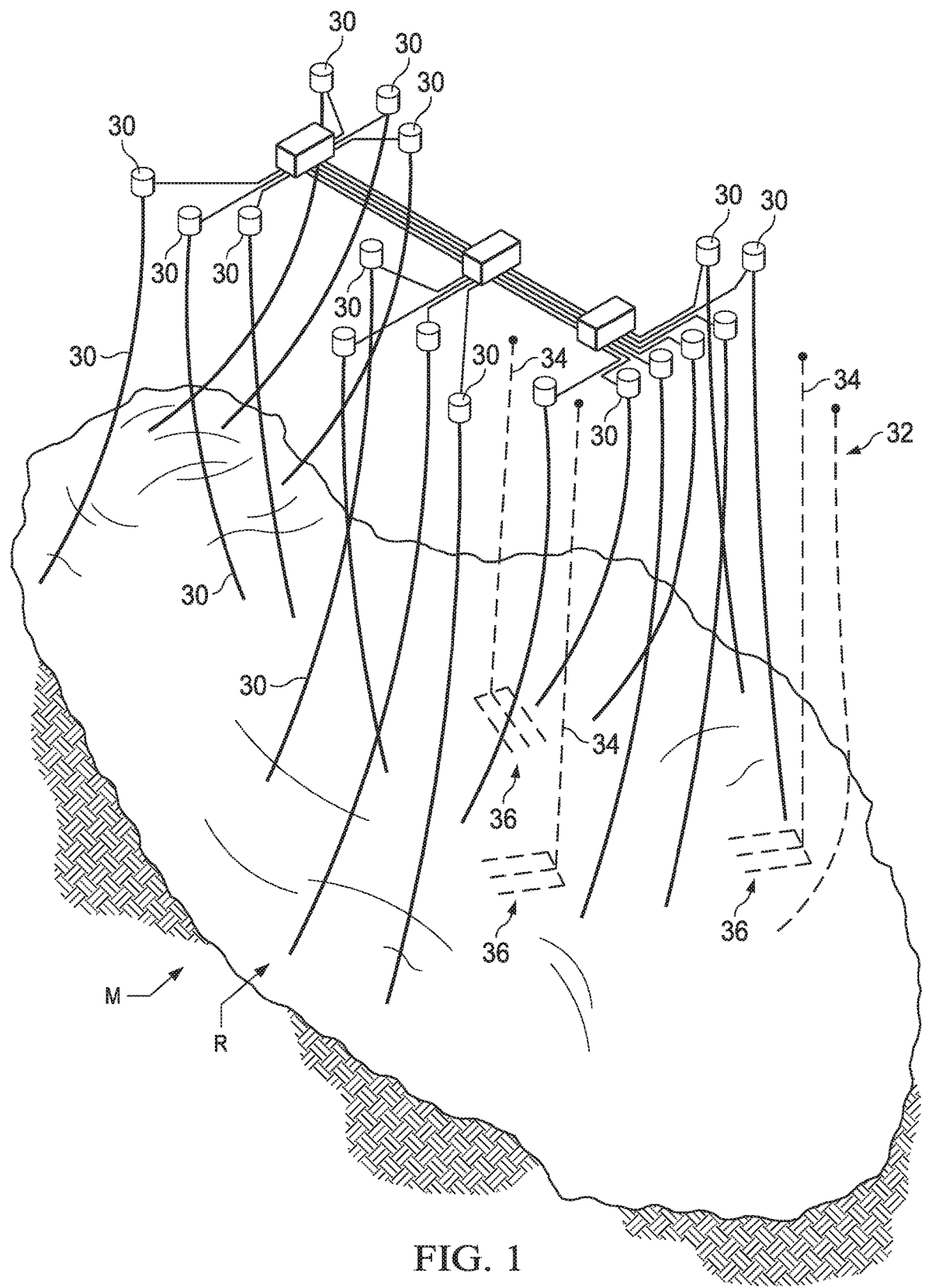
FIG. 1 is a functional block diagram or flow chart of computer processing steps for well performance classification according to the present invention.

In the drawings, FIG. 1 illustrates an example placement of a number of existing wells 30 drilled into a portion of a large reservoir R. The reservoir R is usually of the type and size exemplified by the model M of FIG. 1 is usually one which is known to those in the art as a giant reservoir. A giant reservoir may be several miles in length, breadth and depth in its extent beneath the earth and might, for example, have a volume or size on the order of three hundred billion cubic feet. The existing wells 30 typically include production wells, injection wells and observation wells and are spaced over the extent of the reservoir R.

As mentioned, it is necessary during the life of the reservoir required to plan additional wells. As shown schematically in FIG. 1, such additional wells may be additional proposed vertical wells 32 or additional horizontal wells 34 with lower portions extending laterally or horizontally through the reservoir, as indicated at 36. It should be understood that the number of additional wells shown is illustrative, and that any suitable number might be proposed and evaluated according to the present invention.

Existing techniques for planning new wells have, so far as is known, been based on analytical models to estimate production/injection allocation among existing and planned new wells based on reservoir pressures and fluid saturations. However, such existing techniques for wells designs have been based on generation of a large number of computer intensive and time consuming complex computerized simulations of reservoir performance. So far as is known, such analytical models do not generally accurately predict well performance. Consequently, the well fluid flow allocation has been estimated based on measures available from nearby wells.

Numerical reservoir simulation in high performance computer systems is required to optimize the well design and the expected well performance. An example reservoir simulator is a GigaPOWERS reservoir simulator, for which a description can be found in Dogru, et al. (SPE119272, "A Next-Generation Parallel Reservoir Simulator for Giant Reservoirs," Proceedings of the SPE Reservoir Simulation Symposium, The Woodlands, Texas, USA, 2-4 Feb. 2009, 29 pp.)

However, numerical reservoir simulation requires a huge number of simulation runs that are time consuming and intensive in terms of computer resource demands. Further, establishing or setting up a required number of different simulation scenarios and analyzing the results have been manual processes, requiring reservoir engineers to provide initial well parameter predictions or estimates of well performance and properties based on data from nearby wells or simply from engineer surmise.

Figure 2:
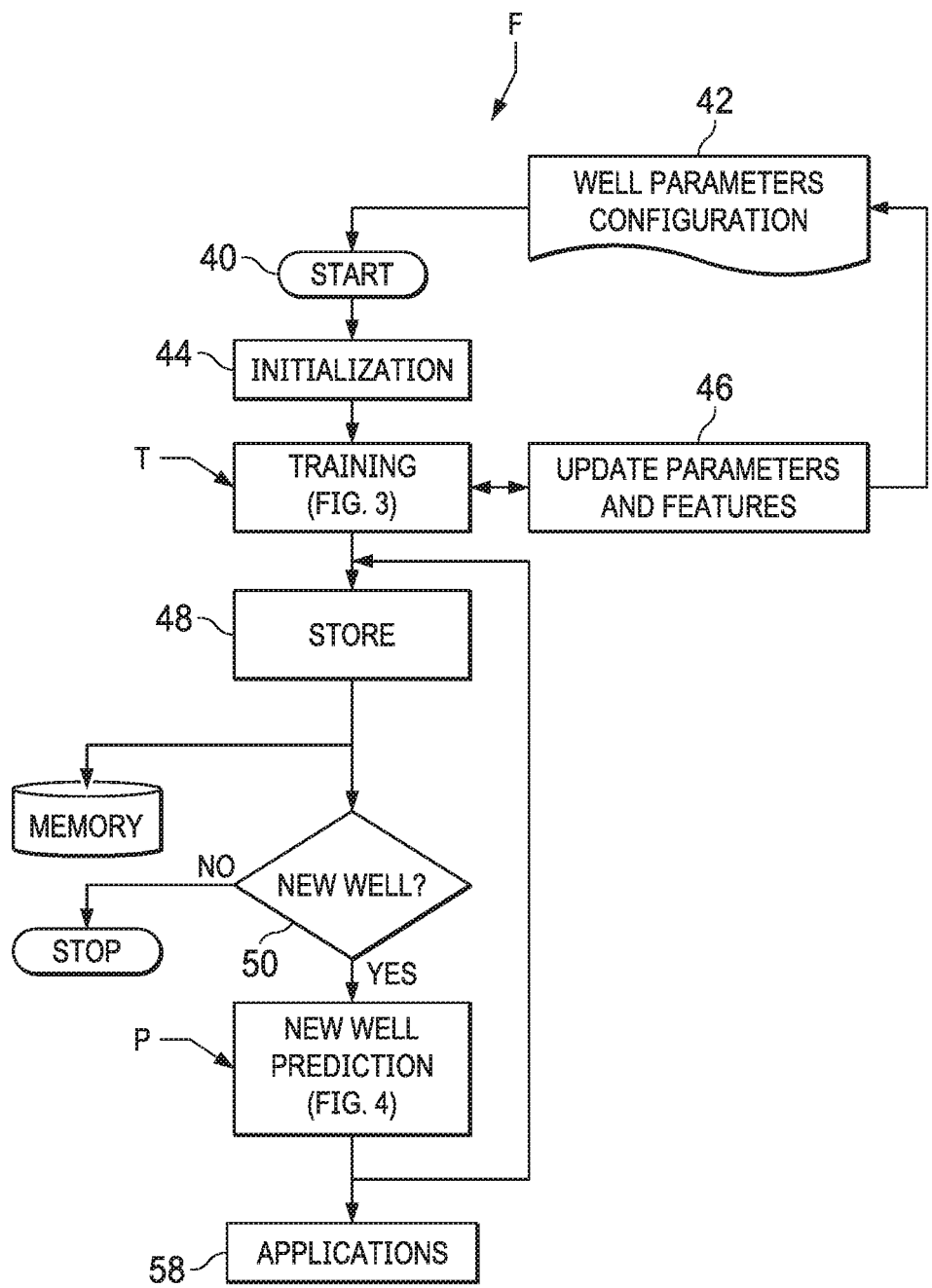
FIG. 2 is a more detailed functional block diagram of computer processing steps of the functional block diagram shown in FIG. 1.

A comprehensive computer implemented methodology of well performance classification according to the present invention is illustrated schematically in a flow chart F in FIG. 2. The flow chart F (FIG. 2) illustrates the structure of the logic of the present invention as embodied in computer program software. Those skilled in this art will appreciate that the flow charts illustrate the structures of computer program code elements including logic circuits on an integrated circuit that function according to this invention. Manifestly, the invention is practiced in its essential embodiment by a machine component that renders the program code elements in a form that instructs a digital processing apparatus (that is, a computer) to perform a sequence of data transformation or processing steps corresponding to those shown.

The flow chart F of FIG. 2 illustrates schematically a preferred sequence of steps of a process for well performance classification. As shown at step 40 in FIG. 2, processing by a data processing system or computer D (FIG. 9) according to the present invention begins. In the start step 40 parameters, features and configurations of a proposed well of the types discussed above indicated schematically at 42 are provided from a permanent storage repository or database storage for processing according to the present invention.

Step 42 is the input or well design specification step. The reservoir engineer is offered a list of properties (well and reservoir properties) to choose from, and is asked to give an input reservoir simulation model which has been history matched. The history matched simulation model encompasses static (geology) and dynamic (fluid flow) data. The data processing extracts the required data in preparation for performance of the present invention.

Examples of such input parameters, features and configurations of a proposed well may include: wellbore deviation; water cut; oil production rate; gas production rate; water production rate; static well pressure; region permeability;

region average porosity; well perforations; distance from oil-water contact depth in reservoir; distance from water-gas contact depth in reservoir; distance from gas-oil contact depth in the reservoir and distance from free water table in the reservoir. It should be understood that other input parameters, features and configurations for proposed wells may also be provided.

The data processing system D is then initialized as indicated at 44 and as indicated at T, training processing according to the present is performed. Details of the training processing of FIG. 2 are set forth in FIG. 3 and will be described below.

As a result of training processing T, the updated parameters and features of the proposed well are available for evaluation as indicated during step 46. If the objective is not met, the present invention's methodology is flexible as indicated in the flowchart F allowing continuous loop-back to update and change the input parameters/features by selecting the desired properties or adjusting previous selections. The present invention thus allows sensitivity runs and refinement of parameters/features selections and quantification of uncertainty in parameters selection and their limits.

If the updated parameters and features of the proposed well in training step T are satisfactory, processing proceeds to step 48, in which the updated parameter and feature results of the proposed well, are stored along with the input parameters in secured data repository or database storage of the data processing system D. The stored parameters and features determined to be satisfactory as a proposed well model resulting from step 48 are then available for display and analysis from the data processing system D. The stored parameters and features determined to be satisfactory as a proposed well model can also then easily be subsequently retrieved to classify a set of unlabeled data (wells) during new well performance analysis or prediction P.

As indicated at step 50, a determination is made whether a proposed new well is to be subject to new well performance analysis or prediction P. If so, processing continues according to new well performance analysis or prediction P, details of which are set forth in FIG. 4 and will be described below. If a proposed new well is not to be subject to new well performance analysis or prediction P, processing stops as indicated at step 50.

Figure 4:
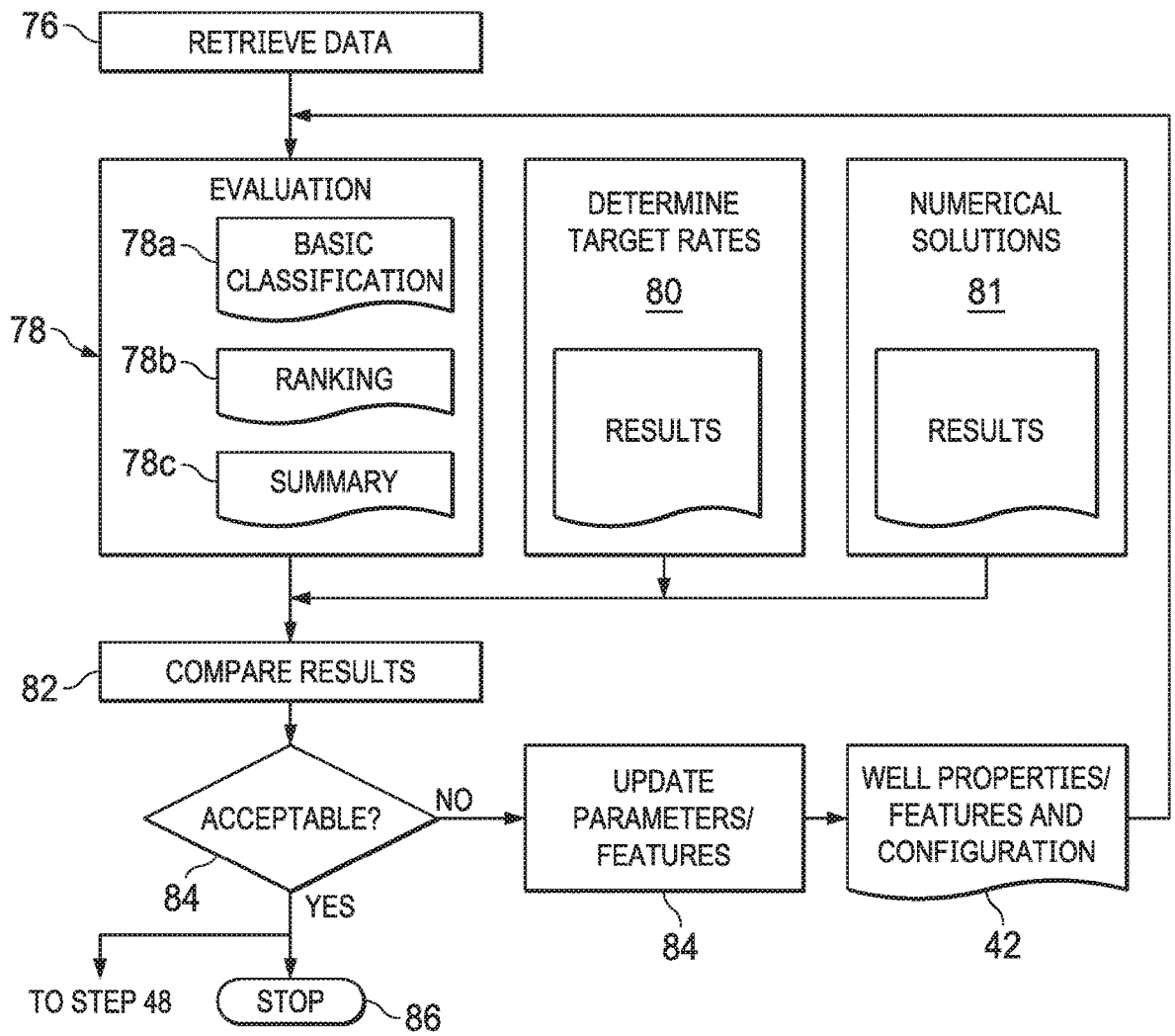
FIG. 4 is a functional block diagram of the workflow for performing the computer processing steps shown in FIG. 2.

According to the present invention, a probabilistic evaluation is conducted to classify the new proposed set of parameters, features and configurations of a proposed well during the new well performance analysis processing P shown in FIGS. 2 and 4. The results representing the predicted performance of a proposed well obtained according to the present invention are then available for application and utilization analysis as indicated schematically at step 58 (FIG. 2).

Nomenclature

Figure 3:
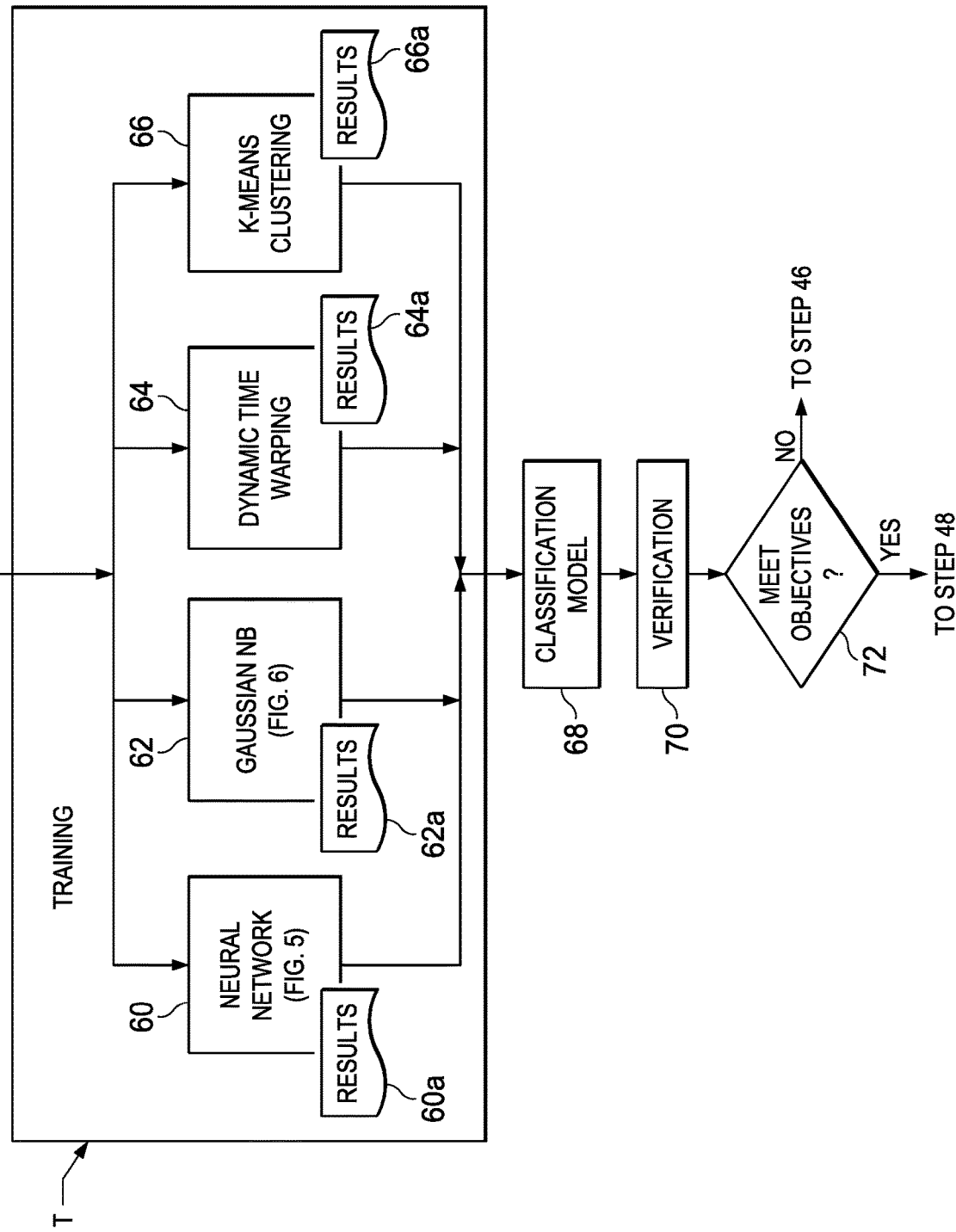
FIG. 3 is a more detailed functional block diagram of computer processing steps of the functional block diagram shown in FIG. 1.

In the following description, symbols are utilized which have the following meanings:
$\sigma^c$: variance
$\mu$: mean
$\chi$: an object in a cluster
J: Sum of minimum distances from each object in a cluster to the cluster center
P: Bayes Probability
DTW: Dynamic Time Wrapping
SUM: Summation Subscripts $\eta$: Number of Samples
c: Cluster
i and j: Indices Training Processing T With the present invention, the methodology of training processing T shown in FIGS. 2 and 3 provides a heterogeneous classifier to qualitatively classify oil well producer performance given: perforation interval(s), completion type, and how far or close the perforated zones are located relative to the free water level or gas cap. Also provided are static geological data regarding major geological bodies such as regional faults and fractures. The training processing according to the present invention, as will be set forth, is applicable to both forming proposed wells 32 and 34 and to adjusting flows in existing wells 30 in the reservoir R.

The features may, if desired, be prioritized before classification begins. The classifier functionality of training processing T utilizes four different techniques. The classification may be applied individually after development or as specifically weighted to apply the pattern recognition to reservoir simulation vector data to classify the wells.

Three supervised learning methods are provided by the methodology of the training processing with the present invention. As indicated at 60 artificial neural networking is one of the supervised learning methods. Another supervised learning method according to the training processing of the present invention is a Bayesian classifier 62, and a third is Dynamic Time warping (DTW) as indicated at 64. In addition, as indicated at 66, an unsupervised learning method, K-means clustering, is used to automate well grouping into similar categories.

Considering now in detail the training processing T (FIG. 3), artificial neural network processing 60 is a supervised learning method for training processing. In the preferred embodiment, the artificial neural network processing 60 is a method that uses what is known as a Multilayer Perceptron (MLP) model. The multilayer perceptron is a feedforward artificial neural network model that maps sets of input data onto a set of appropriate outputs. The multilayer perceptron is composed of multiple layers of nodes in a directed graph, with each layer fully connected to the next one. Except for the input nodes, each node is a neuron (or processing element) with a nonlinear activation function. The multilayer perceptron model uses backpropagation for training the network. The multilayer perceptron model can distinguish data that are not linearly separable to map input data to the output using back-propagation to train the network by updating the weight of the input using a cost function specifying a specific value to the cost or loss of producing an incorrect output value. The results of artificial neural network training 60 are stored for subsequent processing as indicated at 60a.

Figure 5:
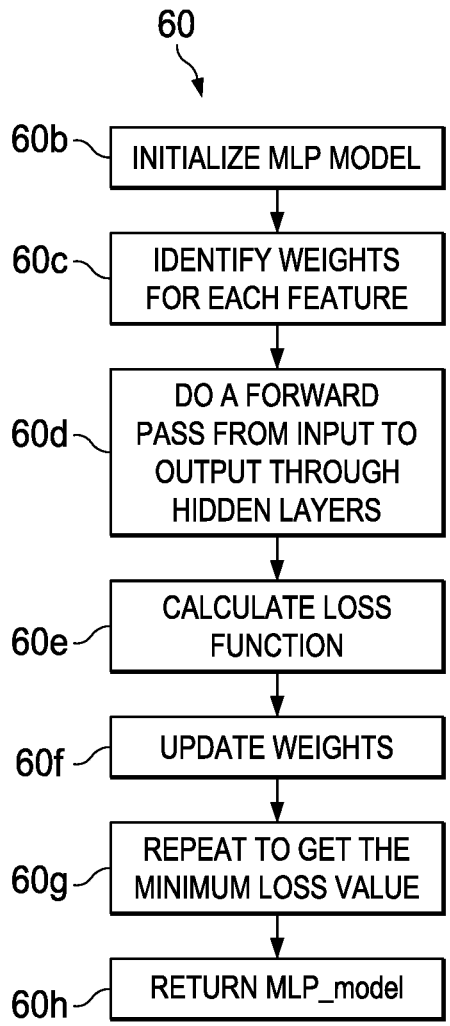
FIG. 5 is a functional block diagram of the workflow for performing a portion of the computer processing steps shown in FIG. 2.

Details of the artificial neural network processing 60 are shown in FIG. 5 and begin with step 60b, during which the neural network processing multilayer prediction model is initialized. During step 60c weights for each feature of the predicted well model to be formed are identified. The initial values for the weights are random and uniformly sampled using a number of features (input layer), hidden layers, and output layer. Step 60d causes performance of a forward pass from input to output through hidden layers. The hidden layers transform the inputs into something that the output layer can use. Those layers are used in the forward pass to calculate the loss each time, and accordingly modify the weights in the backward propagation of errors. This continues until a minimum loss is reached. The relation to well performance with the present invention is that there are two categories: either good or bad in terms of production rate.

Step 60c involves calculation or computerized determination of a loss function for the multilayer prediction model, while for step 60 *f* the identified feature weights are updated based on the results of step 60*f*. As indicated at step 60 *g*, each of steps 60 *d*, 60 *e* and 60*f* are repeated until a minimum loss value is determined to be present. The multilayer prediction model classification results are then stored for subsequent processing as indicated at step 60 *a*, and as indicated at step 60*h* processing returns from neural network processing for further training processing as shown in FIG. 3.

Bayesian classifier 62 is preferably a Gaussian Naïve Bayes in the form of a supervised probabilistic classifier based on applying Bayes' theorem with what is known as a "naive" assumption of independence between every pair of features. Bayesian classifier 62 assumes that the probability $P(x_i|c)$ of the I features X for each class or culture c is distributed according to a Gaussian distribution according to the Nomenclature adopted and identified above:

$$P(x_i \mid c) = \frac{1}{\sqrt{2\pi\sigma_c^2}} \exp\left(-\frac{(x_i - \mu_c)^2}{2\sigma_c^2}\right)$$

Figure 6:
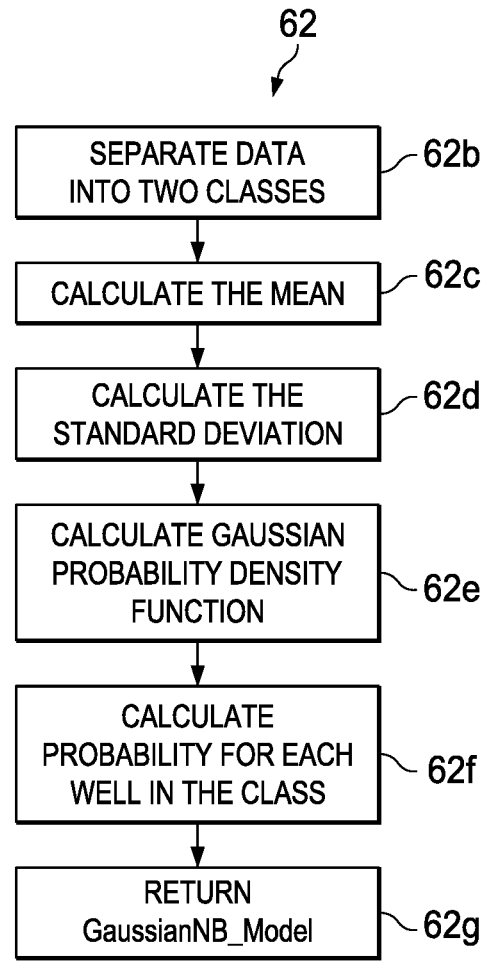
FIG. 6 is a functional block diagram of the workflow for performing a portion of the computer processing steps shown in FIG. 2.

The results of Bayesian classifier training 62 are stored for subsequent processing as indicated at 62a. Details of the Bayesian classifier training 62 are shown in FIG. 6 and begin with step 62b where the data for the proposed model is separated into two classes c. During step 62c the mean value $\mu_c$ for the two separated classes is determined. In step 62d, standard deviation σ is determined. Then, during steps 62e and 62f, the Gaussian probability density function and the Gaussian probability function $P(x_i|c)$ is determined, and as indicated at step 62g processing returns from Bayesian classification processing for further training processing as shown in FIG. 3.

The dynamic time warping (or DTW) processing 64 is a supervised learning method that finds an optimal match between two series by wrapping the time dimension and computing the distance matrix between the two series of well data. The sequences are "warped" non-linearly in the time dimension to determine a measure of their similarity independent of certain non-linear variations in the time dimension. This sequence alignment method is often used in time series classification.

$DTW_{AB}$=SUM (shortest paths$_{AB}$)

With the present invention, dynamic time warping is combined with a k-nearest neighbors clustering to predict a label for a resultant object using the label for the nearest neighbors.

Figure 7:
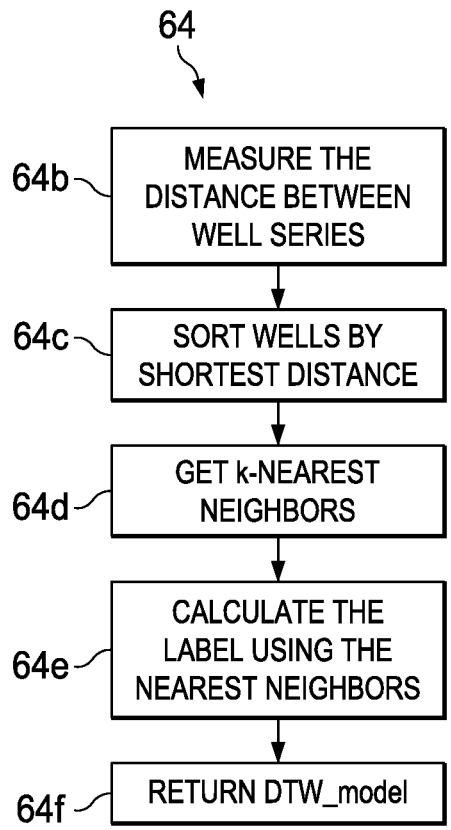
FIG. 7 is a functional block diagram of the workflow for performing a portion of the computer processing steps shown in FIG. 2.

The results of dynamic time warping processing 64 are stored for subsequent processing as indicated at 64a. Details of the artificial neural network processing 60 are shown in FIG. 7 and begin with step 64b, where the time distance between the well series is measured, followed by step 64c, where the wells in the series are sorted by shortest distance between adjacent wells. Step 64d is performed to assemble or gather the sorted wells into groups of the k-nearest neighbors. The grouping assignment or label is based on whether a well is good or bad, based on the majority of the k-nearest wells being good or bad for the proposed well model. The grouping assignment or label is determined using the k-nearest neighbors during step 64e and the results stored as indicated at 64a. Then, during step 64f processing returns from dynamic time warping processing for further training processing as shown in FIG. 3.

The K-means clustering processing during step 66 is an unsupervised algorithm that classifies the input data set into k-clusters. The centroid for each cluster keeps moving until distances from all objects in the cluster to that center is minimized according to the nomenclature adopted and identified above:

$$J = \sum_{i=1}^{n} \min_{\mu_j \in C}(\|x_j - \mu_j\|^2)$$

Figure 8:
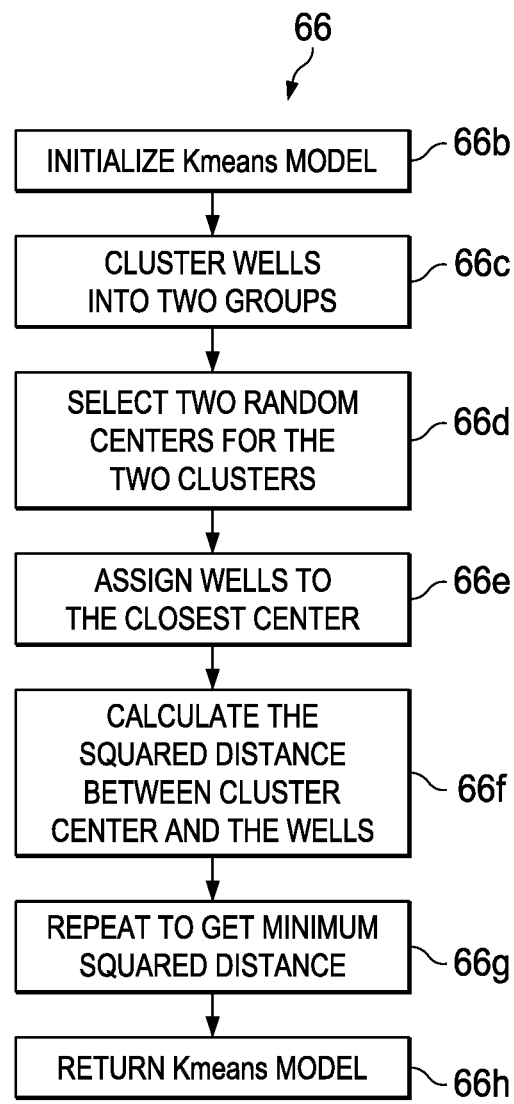
FIG. 8 is a functional block diagram of the workflow for performing a portion of the computer processing steps shown in FIG. 2.

The results of K-means clustering processing during step 66 are stored for subsequent processing as indicated at 66a. Details of the K-means clustering processing 66 are shown in FIG. 8 and begin with step 66b, during which the K-means clustering model is initialized. During step 66c, the existing wells are arranged or clustered into two groups. Step 66d involves selection of a random center for each of the two clusters of wells. During step 66e the wells are assigned to the closest of the two centers selected during step 66d. The squared distance between each cluster center and the wells assigned it are then determined in step 66f. As indicated at step 66g, each of steps 66d, 66e and 66f are repeated until a minimum squared distance between the center and the cluster's wells is determined to be present. The multilayer prediction model classification results are then stored for subsequent processing as indicated at step 66a, and as indicated at step 66h, processing returns from K-means clustering processing for further training processing as shown in FIG. 3.

During the training processing T (FIG. 3) after results are obtained from the classifier functionality described above, whether by supervised or unsupervised learning, a classification model as indicated schematically at 68 is formed. Classification model 68 is thus a model trained using one of the pattern recognition processes (Neural network 60; Gaussian naïve Bayes 62, Dynamic Time Wrapping 64, and K-means Clustering 66). The formed classification model 68 is thus available to predict the labels for any unprocessed set of well data, whether existing or new datasets.

The formed classification model 68 is then subject to a classification model verification as indicated at step 70. In classification verification step 70, the results of the classification models are used to predict the labels for a labeled set of data to verify the percentage of match or mismatch, and verify as indicated at step 72 the accuracy of the classification model 70 before using it to predict unlabeled data.

If it is determined during step 72 that the accuracy of the classification model 70 does not meet the specified objectives, the present invention is flexible allowing repeated iterations or loop-back to step 46 (FIG. 2) to update and change the input parameters/features by selecting desired well properties. This allows sensitivity runs and refinement of parameters/features selections and quantification of uncertainty in parameters selection and their limits.

New Well Performance Analysis or Prediction P

Considering now in detail the new well performance analysis or prediction processing P (FIG. 4), as indicated at step 76 (FIG. 4), the stored parameters and features for a proposed well model resulting from step 48 are retrieved to predict or classify performance of a new or existing well. During step 78, classification of a well based on the stored parameters and features is preformed according to the workflow sequence set forth below. The program language is known as Python with scikit; a machine learning library which has most of the machine learning algorithms (classes and functions predefined).

TABLE 1

Start of workflow
    Input set of properties ( )
        Get the model case
        Get list of chosen properties (static, dynamic)
        Get drainage area size
        Get good/bad reference property or feature
        Get good/bad reference value
    Parse case filed ( )
        Get average value for static property for each well
        Get all time step values for dynamic properties for each well
    Analyze properties/well performance ( )
        Divide input set into train and test data
        Read classification algorithm choice
            If algorithm = Clustering
                Classification model = Clustering with kmean (train data)
            Else if algorithm = Gaussian NP:
                Classification model = Classify with Gaussian NB (train data)
            Else if algorithm = Neural Network:
                Classification model = Classify with Neural Network (train data)
            Else if algorithm – Dynamic Time Wrapping
                Classification model = Classify with Dynamic Time Wrapping (train data)
        Good/bad labels = Classify new wells (train data, classification model)
        Good/bad labels = Classify new wells (labeled wells, classification model)
        Plot (good/bad wells)
        If satisfied:
            Good/bad labels = Classify new wells (unlabeled wells, Classification Model)
        Else:
            Go to "Input set of properties ( )"
    Build best case ( )
        Set best algorithm
        Set weight for each property
        Get the optimum set of good predicted unlabeled wells
End of the workflow The prediction or classification performed according to well performance analysis or prediction processing P with the present invention during step 78 is a probabilistic determination to qualitatively classify oil well performance based on well perforation interval(s); well completion type; and how far or close the perforated zones are located relative to the free water level or gas cap for the well or wells being classified. The results obtained from step 78 may be provided by the data processing system D in several forms as indicated in FIG. 4: a single or basic classification list as schematically indicated at 78a; a ranking as indicated at 78b, indicating whether the well(s) are classified as good or bad; or as indicated schematically at 78c a summary report for the well(s).

With the present invention, options are available to compare or verify during step 82 the results of the probabilistic determination of qualitative classification of oil well performance probabilistic resulting from step 78. The comparison during step 82 is with results from other methods, such as analytical solution as shown at 80 and numerical reservoir simulation as shown at 81.

As a result of well performance analysis or prediction processing P, the results of the probabilistic determination of qualitative classification of oil well performance probabilistic resulting from step 78 are available for evaluation as indicated during step 84. If the results are not considered acceptable, the resultant updated parameters and features for the well or wells considered not acceptable are reported as indicated at 42 for further cycles of step 78. If the results are considered acceptable, processing may stop as indicated at step 86, or processing may return to step 48 (FIG. 2). The acceptable results are thus stored as updated parameters and features of the well.

Processing then proceeds to applications step 58, If the well which has been classified as acceptable is a proposed new well for the reservoir R, applications step 58 takes the form of drilling and completion or forming of the well. As has been set forth above, the well being formed by drilling and completion may take the form of a vertical well 32 or a horizontal well 34. The applications step 58 for a well which has been classified as acceptable may also be a modification of flow for an existing well 30. The existing well flow may be production fluid flowing from, or fluid injected into such a well. Production flow from the well is in such cases increased or decreased by adjustment of well controls and valves. Injection of fluid into the well is adjusted at the wellhead.

Figure 9:
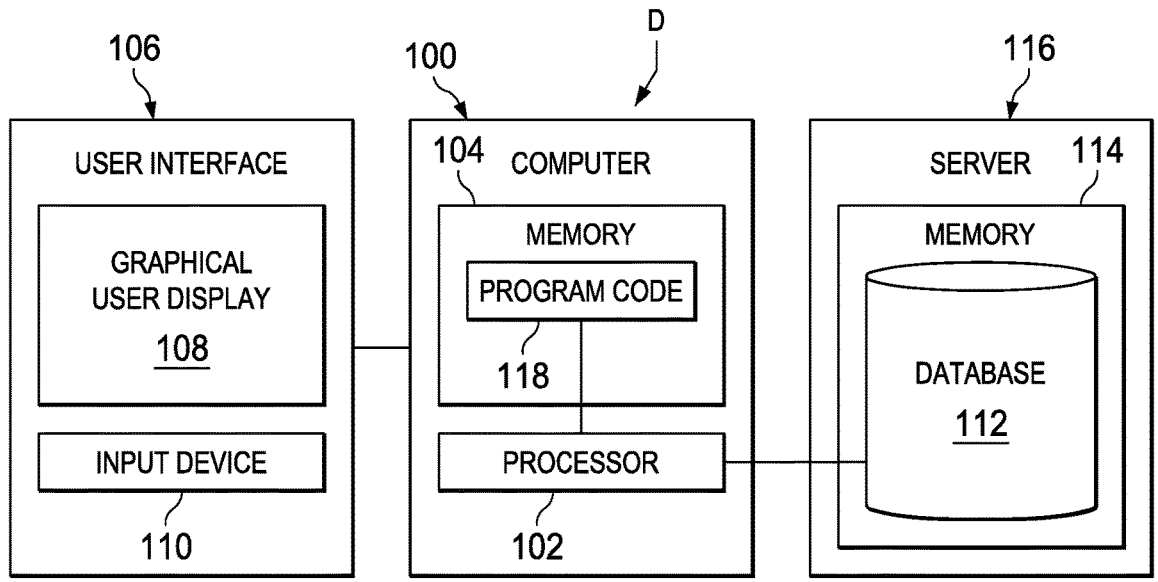
FIG. 9 is a schematic diagram of a computer network for well performance classification according to the present invention.

As illustrated in FIG. 9, a data processing system D according to the present invention includes the computer 100 having processor 102 and memory 104 coupled to the processor 102 to store operating instructions, control information and database records therein. The computer 100 may, if desired, be a portable digital processor, such as a personal computer in the form of a laptop computer, notebook computer or other suitable programmed or programmable digital data processing apparatus, such as a desktop computer. It should also be understood that the computer 100 may be a multicore processor with nodes such as those under the registered trademark INTEL® from Intel Corporation, or from Advanced Micro Devices, Inc., under its registered trademark (AMD®), or a mainframe computer of any conventional type of suitable processing capacity such as those available from International Business Machines Corporation of Armonk, N.Y. (under its registered trademark IBM®), or other source.

The computer 100 has a user interface 106 and an output display 108 for displaying output data or records of predicting well performance based on target well production rates, reservoir geological properties and computerized reservoir simulation results according to the present invention. The output display 108 includes components such as a printer and an output display screen capable of providing printed output information or visible displays in the form of graphs, data sheets, graphical images, data plots and the like as output records or images.

The user interface 106 of computer 100 also includes a suitable user input device or input/output control unit 110 to provide a user access to control or access information and database records and operate the computer 100. Data processing system D further includes a database 112 stored in computer memory, which may be internal memory 104, or an external, networked, or non-networked memory as indicated at 114 in an associated database server 116.

The data processing system D includes program code 118 stored in memory 104 of the computer 100. The program code 118, according to the present invention is in the form of computer operable instructions causing the data processor 102 to attenuate cross-talk by trace data processing in the cross-spread common-azimuth gather domain according to the processing steps illustrated in FIG. 11.

It should be noted that program code 118 may be in the form of microcode, programs, routines, or symbolic computer operable languages that provide a specific set of ordered operations that control the functioning of the data processing system D and direct its operation. The instructions of program code 118 may be may be stored in the memory 104 of the computer 100, or on a computer diskette, magnetic tape, conventional hard disk drive, electronic read-only memory, optical storage device, or other appropriate data storage device having a computer usable medium stored thereon. Program code 118 may also be contained on a data storage device such as server 116 as a computer readable medium, as shown.

Figure 10:
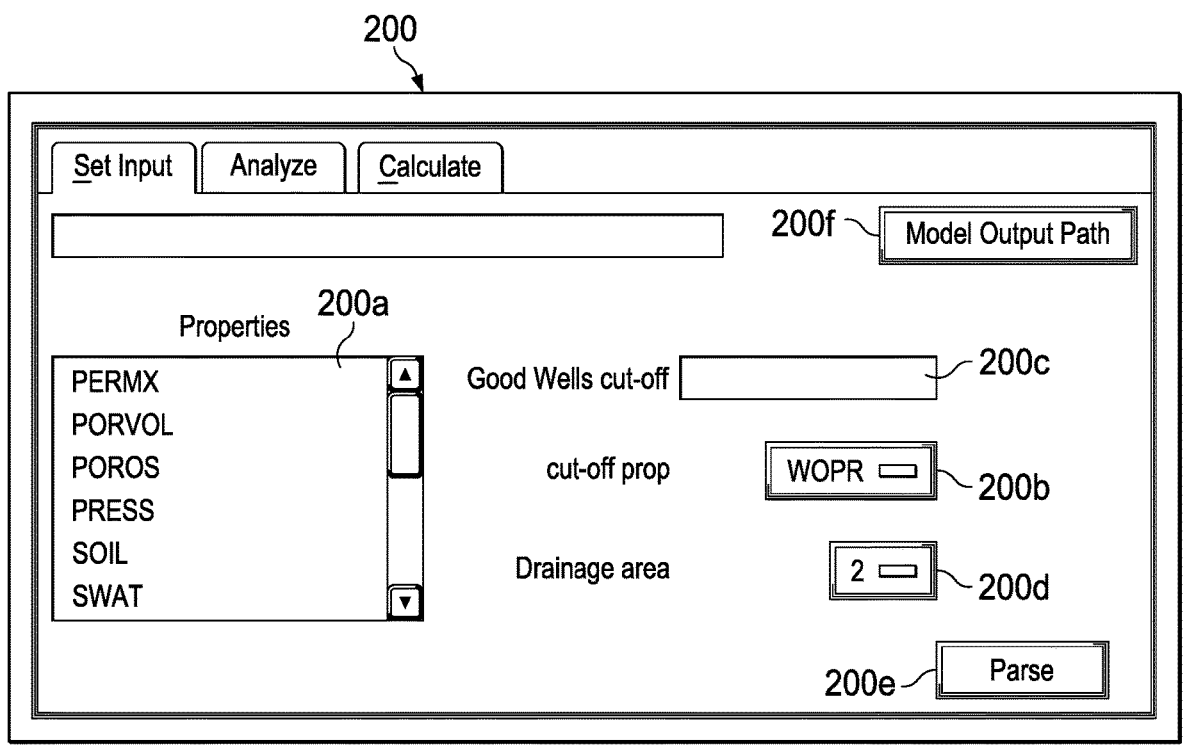
FIG. 10 is an example display of an image formed during processing according to the present invention with the computer network of FIG. 9.

FIG. 10 illustrates an example display screen 200 on user interface 106 of a data processing system D for model selection among selected reference properties provided as reservoir vector data formed as input reservoir simulation data for processing and proposed well classification according to the present invention. Examples of such properties are indicated at window 200a are permeability (PERMX); pore volume (PORVOL); porosity (POROS); pressure (PRESS); oil saturation (SOIL); and water saturation (SWAT).

Figure 15:
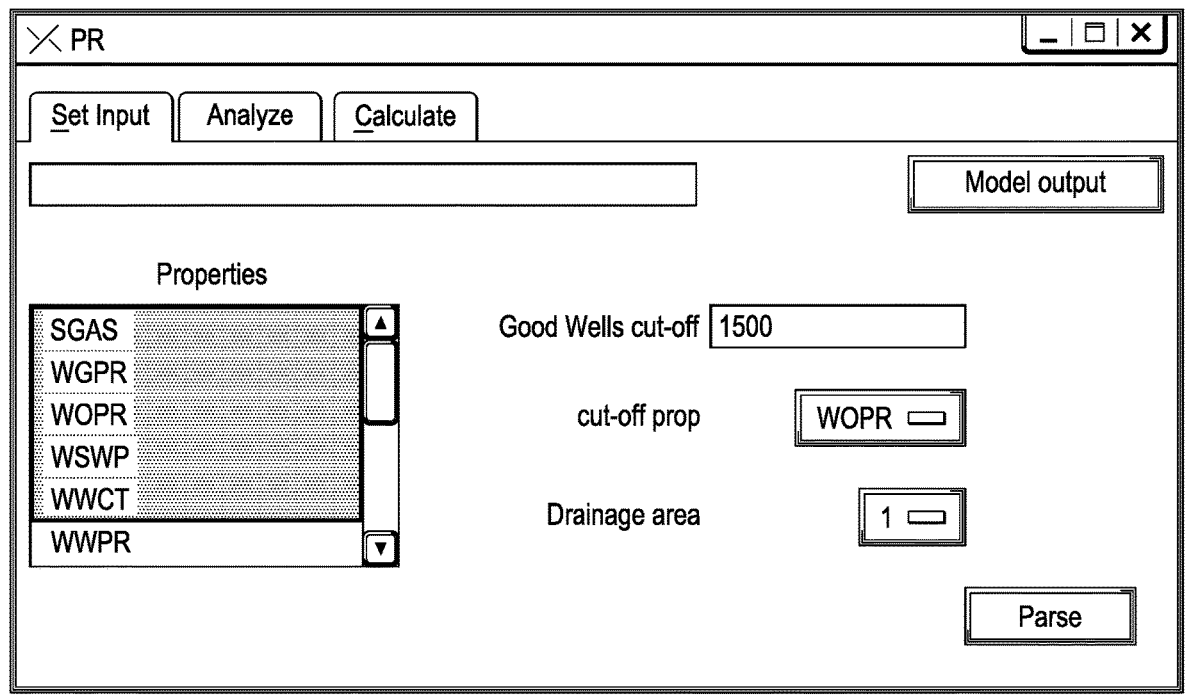
FIG. 15 is an example display of an image formed during processing according to the present invention with the computer network of FIG. 9.

There are a number of other such properties, such as are shown in FIG. 15 in another view of the window 200a: gas saturation (SGAS); gas production rate (WGPR); oil production rate (WOPR); static well pressure (WSWP); water cut (WWCT); and water production rate (WWPR). It should be understood that other properties of reservoir R developed as reservoir vector data by reservoir simulation may be used to provide input reservoir data for well performance prediction in the manner set forth above.

As indicated at 200b in FIG. 10, a user reservoir engineer/analyst specifies a selected particular one of the reference properties, such as well oil production rate or WOPR for performance prediction, and specifies a value for the selected reference property for input and display at a window 200c. A window 200d displays a selected drainage area identifier code indicating the drainage area of the reservoir applicable to the proposed well or existing well which is being classified according to the present invention. A PARSE indicator 200e is provided for parsing to select among proposed or existing wells for classification. This involves several functionalities: (a) Reading some of the simulation output files; (b) Averaging the time steps value for the dynamic properties; (c) Averaging the drainage area cells values for static properties; (d) Identifying good and bad wells depending on the property and value selected by users; and (e) Creating train and test/labeled groups of wells. A model output window 200f allows a user to request an output display of well performance analysis as a result of step 78.

Figure 11A:
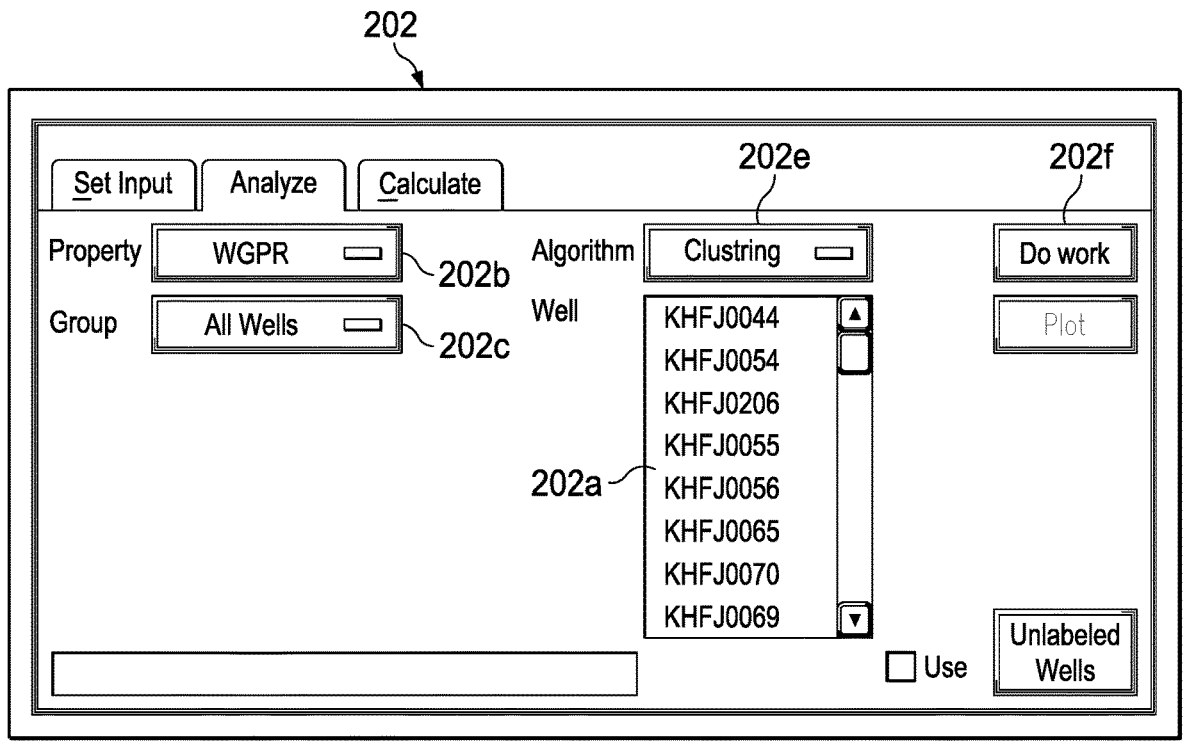
FIGS. 11A and 11B are example displays of images formed during processing according to the present invention with the computer network of FIG. 9.

In FIG. 11A, an example display screen 202 according to the present invention illustrates selection of a reservoir property (WGPR or well gas production rate) as indicated at property window 202a indicated at window 202b. As indicated at group window 202c, designated ones of the group of wells may be designated. "ALL" of the group of wells are indicated in FIG. 11A. A window 202e in FIG. 11A displays the well performance analysis performed during processing step 78. K-means clustering is indicated in FIG. 11A to be performed, which is initiated by and so indicated at START window 202f.

Figure 11B:
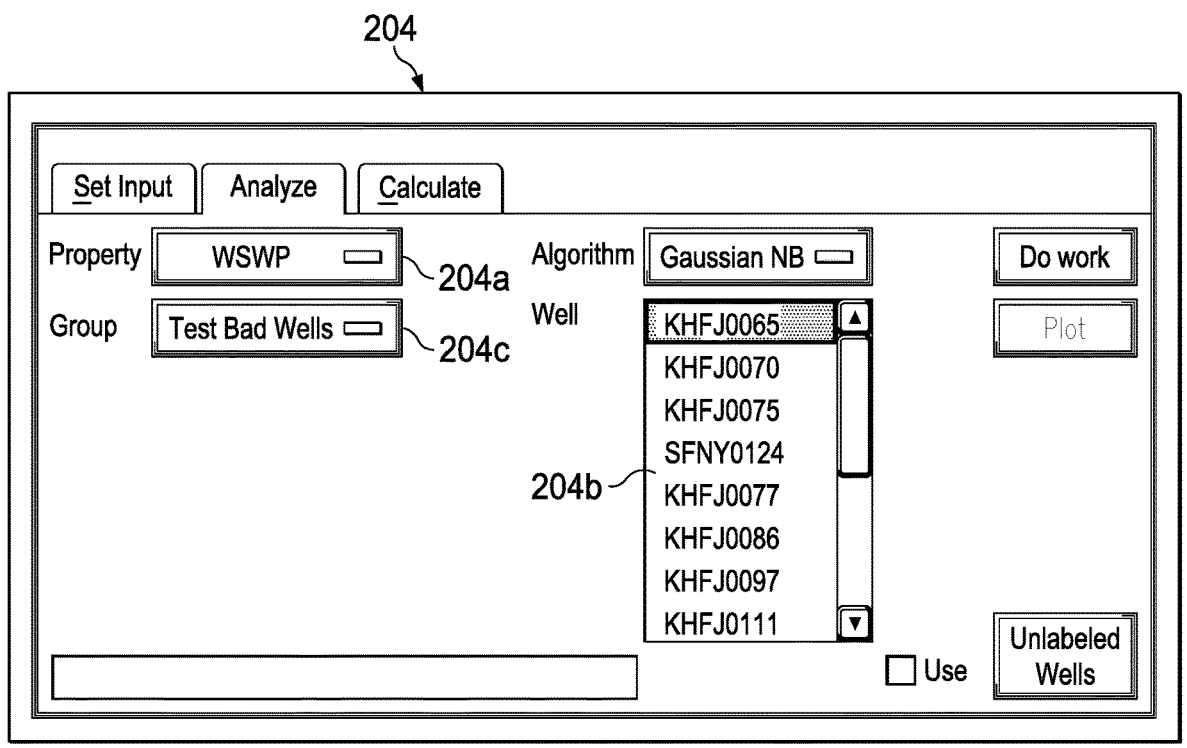

In FIG. 11B, another example display screen 204 illustrates a display property selection of WSWP or water saturation percentage at property window 204a for designated wells in window 204b which are to be processed to determine whether they are "BAD" by Gaussian Naive Bayesian classification identified in window 204c.

Figure 12:
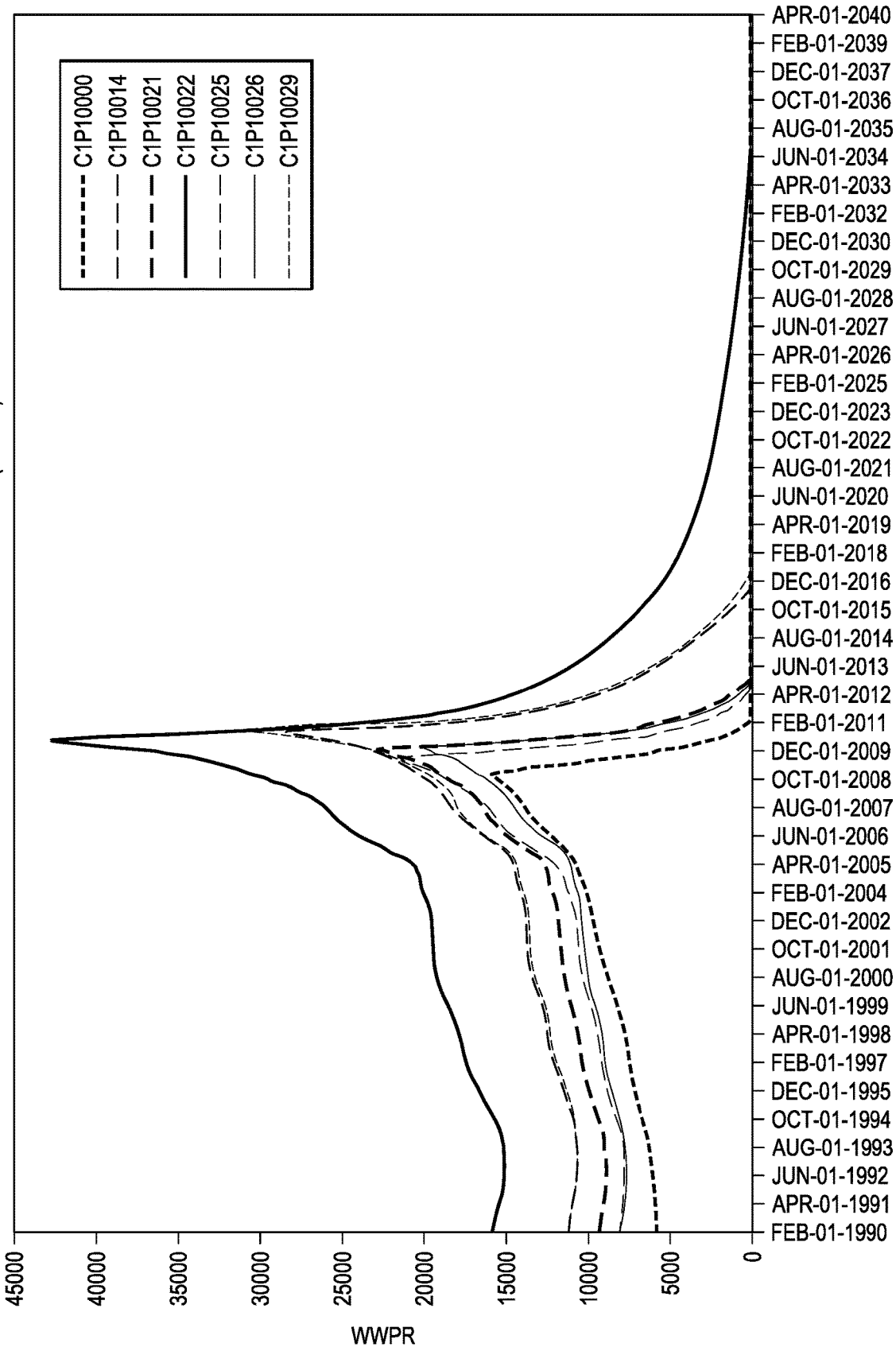
FIGS. 12, 13, and 14 are example displays of results obtained as a result of processing according to the present invention with the computer network of FIG. 9

FIG. 12 is an example plot of well water production rate for seven existing wells in a reservoir such as indicated at R in FIG. 1 as a function of time during production as determined by reservoir simulation. These wells are classified as BAD from Gaussian Naïve Bayesian classification during step 78. FIG. 12 shows the water production rate for bad wells. So, if the wells plotted were showing high values, which means the processing is working well because bad wells show a high water production rate. On the other hand, if the plot of bad wells showed low values then that may not be a good indicator. Also, when plotting those wells into a train or labeled group during step 78, it will be easier for a user to see if the wells known to be good or bad will be plotted as expected or not. If the wells are divided during processing into good or bad properly, then a user can use those existing wells in predicting performance of unlabeled wells.

Figure 13:
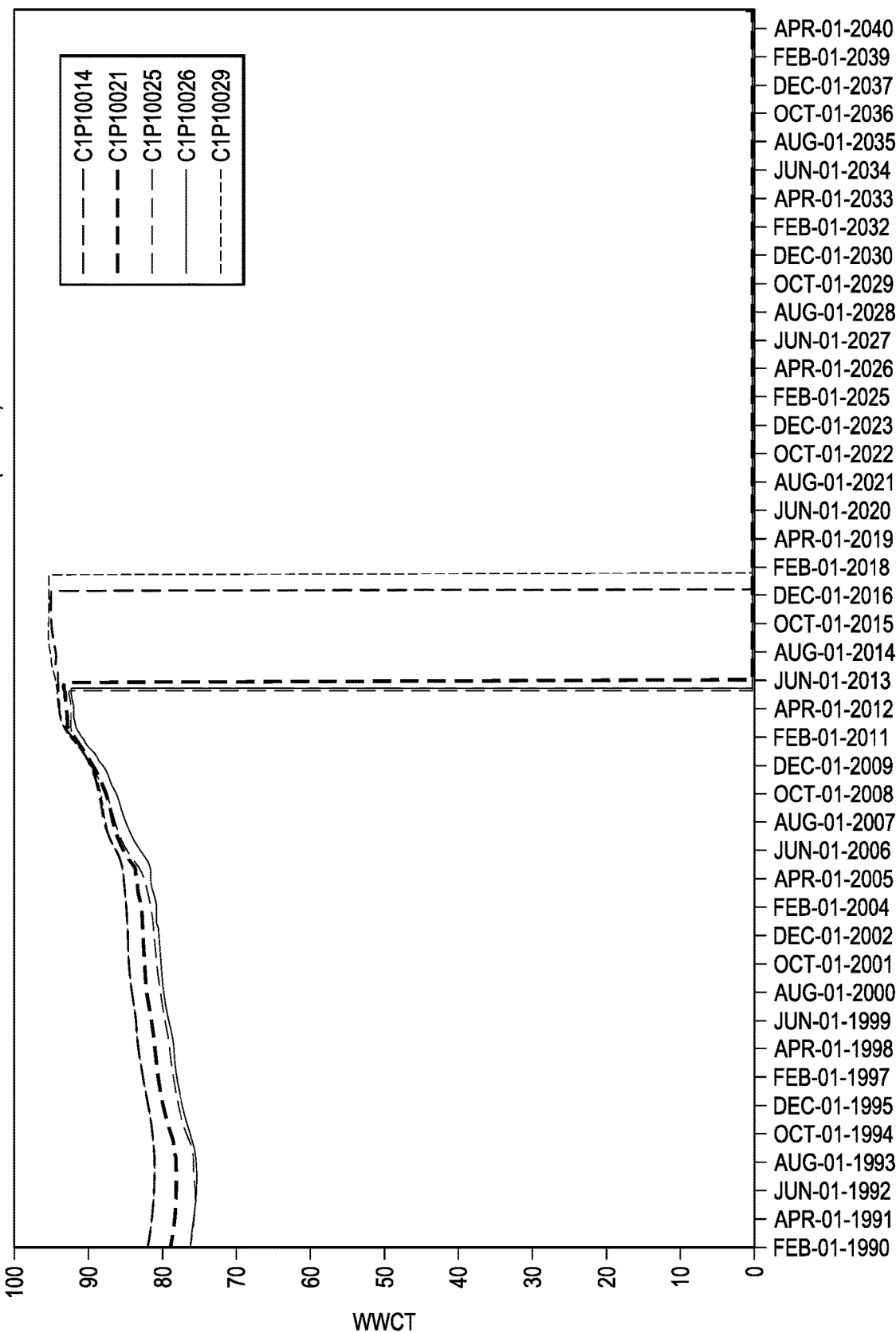

FIG. 13 is another example plot of water cut for five existing wells in a reservoir such as indicated at R in FIG. 1 as a function of time during production as determined by reservoir simulation. These wells are classified as BAD from Gaussian Naive Bayesian classification during step 78. Again, as with the results displayed in FIG. 12, if the processing results in FIG. 13 indicate as bad wells those known to be bad, data for these known bad wells are available to be used in new well prediction.

Figure 14:
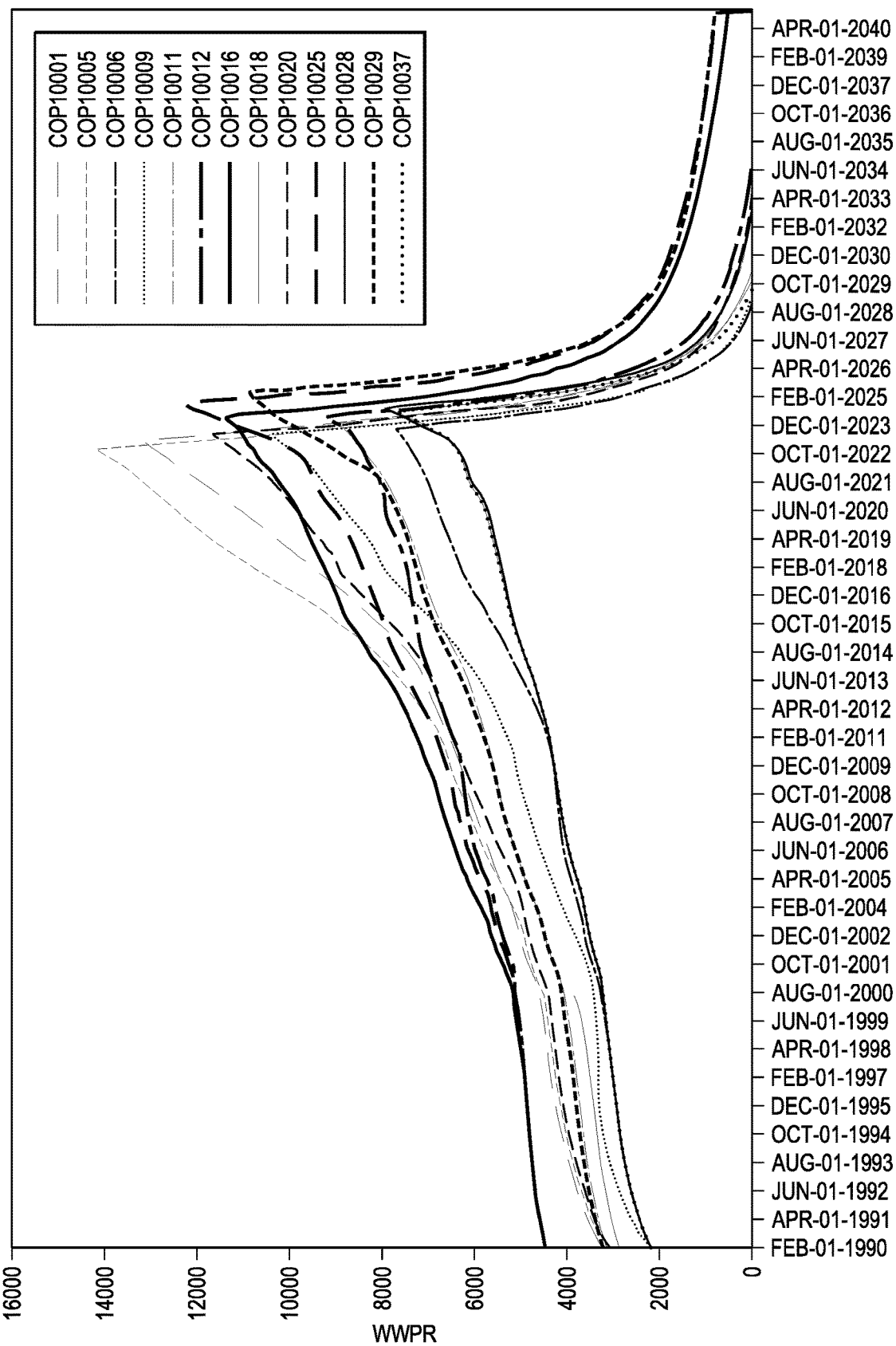

FIG. 14 is another example plot of well water production rate for thirteen existing wells in a reservoir such as indicated at R in FIG. 1 as a function of time during production as determined by reservoir simulation. These wells are classified as GOOD from Gaussian Naive Bayesian classification during step 78.

As mentioned above, if results like those shown in FIG. 14 confirm that wells already known to be good are correctly identified, data from those wells is also available for use in new well prediction.

A table below is a summary report formed as indicated at step 78c as a result of similar Gaussian Naive Bayesian well water cut classification during step 78.

| | WWCT/Gaussian NB | | |
|---|---|---|---|
| | Train | Labeled | Unlabeled |
| Good wells | 1 | 1 | 0 |
| Bad wells | 68 | 16 | 17 |
| Total wells | 69 | 17 | 17 |

Error 5.90%

The error percentage in the information above is important because it is an accuracy indicator for use with a specific property. In this case the error was 5.9% which means only one well out of 17 wells were wrongly classified, a very good result. The last column is unlabeled wells which shows here zero good wells vs 17 bad wells. The column before is showing the labeled wells, and it shows one good well vs 16 bad wells. This means there is only one well that was predicted good during water cut prediction by Gaussian NB modeling, while its label is shown as BAD.

FIG. 15 is another example display similar to FIG. 10 on user interface 106 of well water production rate or WWPR for performance prediction and a display at a window 200c of a cut-off value of 1500 bbls/day for the selected well water production classification cut-off for another drainage area. Another table below is a summary report formed as indicated at step 78c as a result of similar K-means well water saturation percentage classification during step 78.

| WSWP/Clustering | | | |
|---|---|---|---|
| | Train | Labeled | Unlabeled |
| Good wells | 1 | 1 | 0 |
| Bad wells | 68 | 16 | 16 |
| Total wells | 69 | 17 | 17 |

Error 0.00%

In these results, one test labeled well is correctly identified as good by k-means clustering, modeling of static well pressure. Zero percent error rate is indicated for the k-means clustering.

Figure 16:
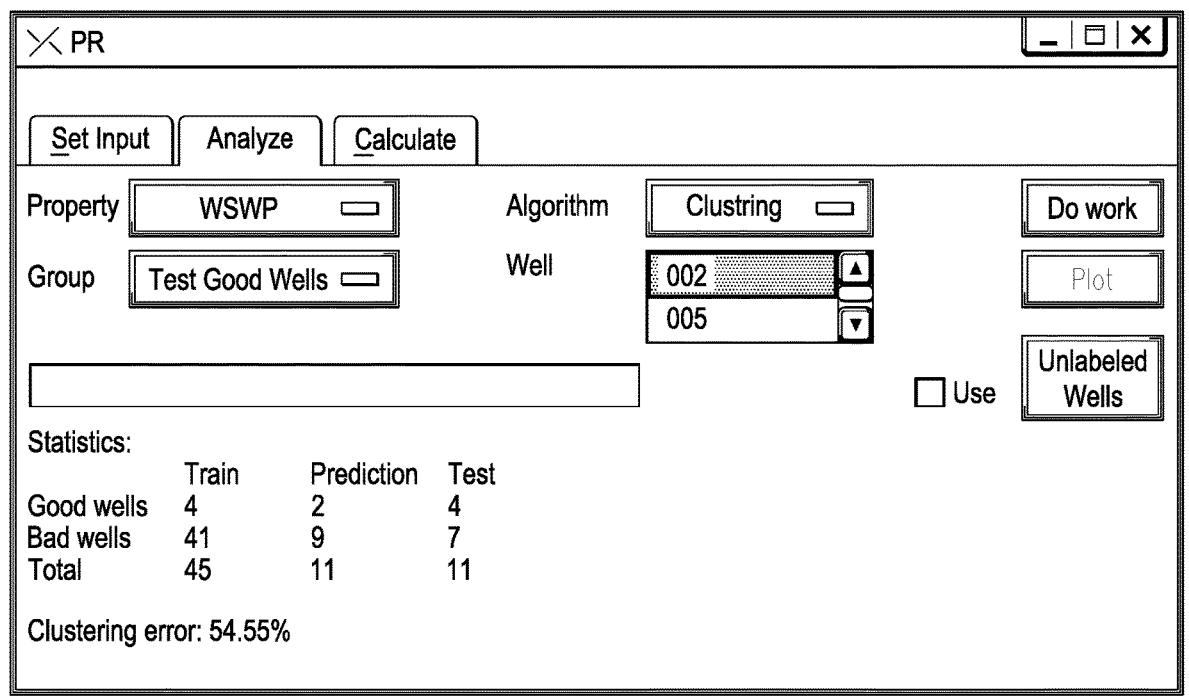
FIG. 16 is an example display of an output summary of well performance classification formed during processing according to the present invention with the computer network of FIG. 9.

FIG. 16 is an example display screen image of user interface 106 for a report of K-means clustering classification for static well pressure as a property from training processing for forty five proposed wells, four of which are indicated as GOOD. Predicted results for eleven such wells indicate two are predicted good. For these k-means clustering processing results, the error rate indicated is to be 54.55%.

Figure 17:
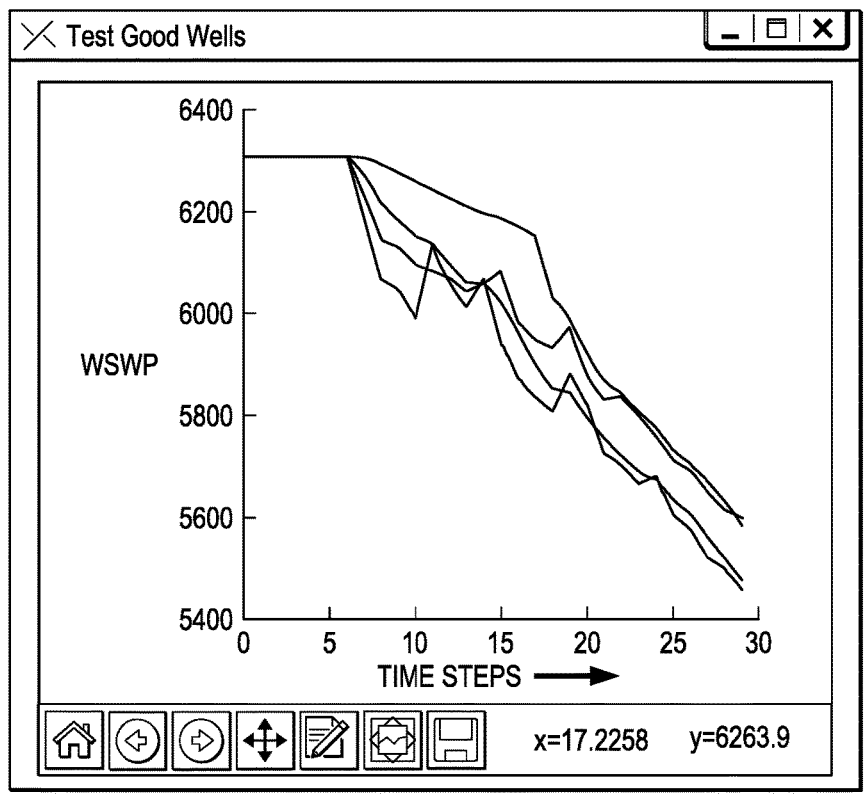
FIG. 17 is an example display of an image of well classification results formed during processing according to the present invention with the computer network of FIG. 9.

FIG. 17 is a plot of wells indicated as GOOD based on static pressure (WSWP) as a property value. The data plots show static well pressure declining as a function of time, which is to be expected.

Figure 18:
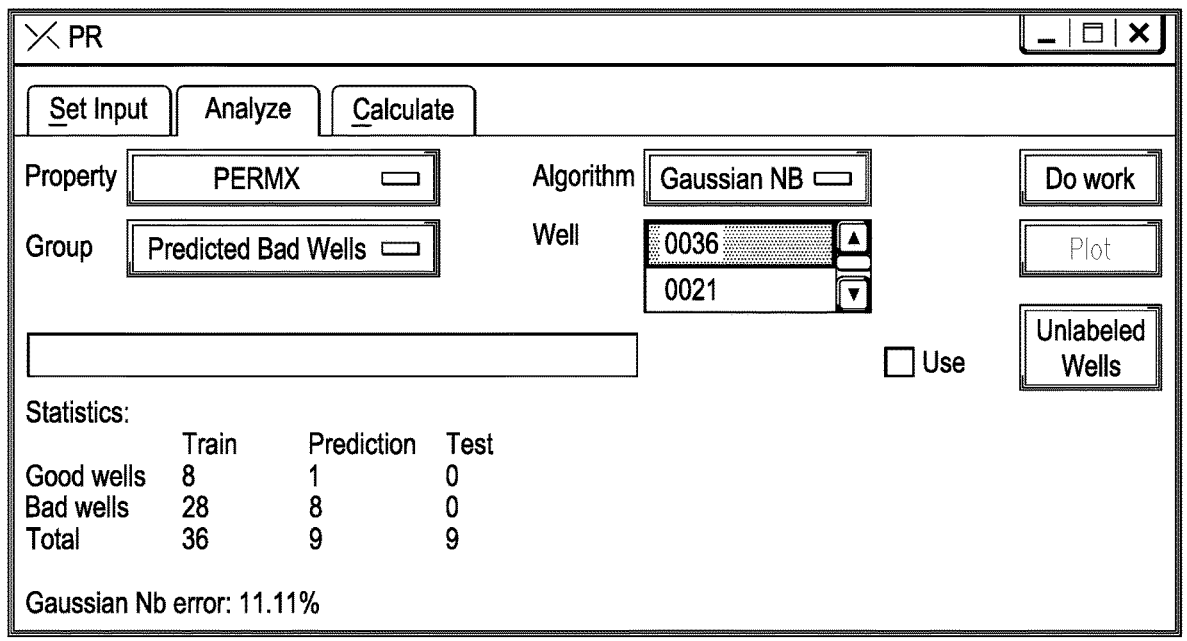
FIG. 18 is an example display of an output summary of well performance classification formed during processing according to the present invention with the computer network of FIG. 9.

FIG. 18 is an example output display screen 206 formed on user interface 106 of the data processing system D illustrating results of Gaussian Naïve Bayesian permeability classification during step 78. An accompanying report which is also displayed indicates statistics regarding the classification performed indicating one well out of nine is wrongly classified as BAD, an error rate of about 11%.

Figure 19:
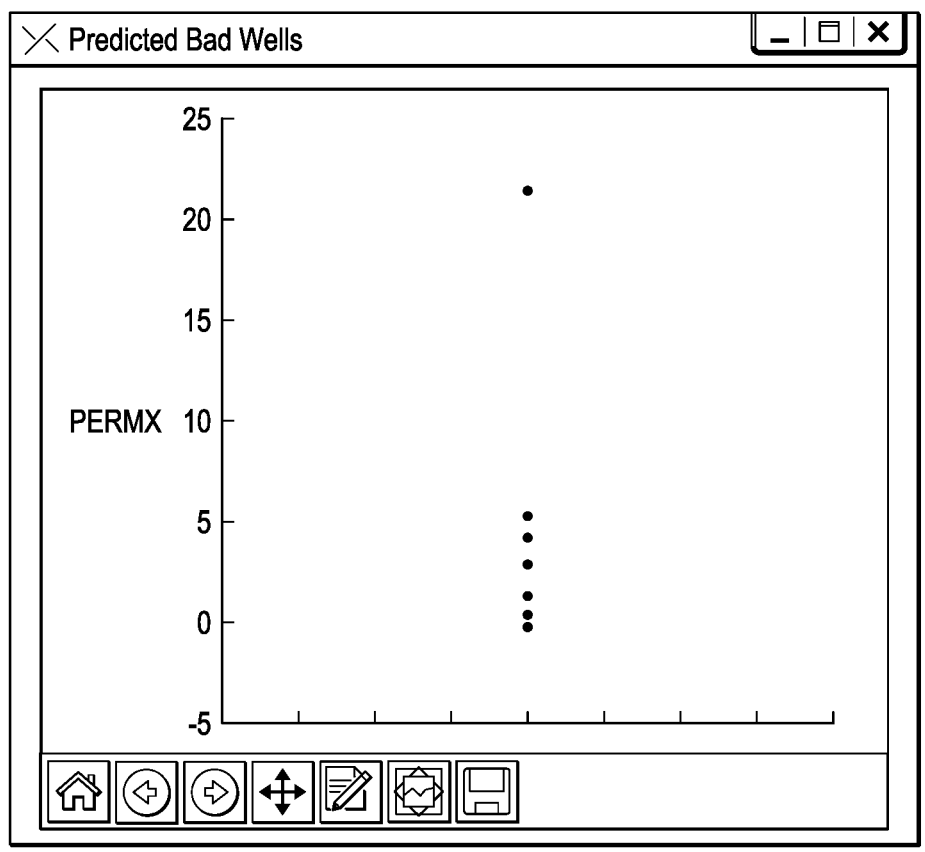
FIG. 19 is an example display of an image of well classification results formed during processing according to the present invention with the computer network of FIG. 9.

FIG. 19 is a plot of wells indicated as BAD based on permeability (PERMX) as a property value. The permeability values for those wells being labeled are indicated on the y-axis.

Figure 20:
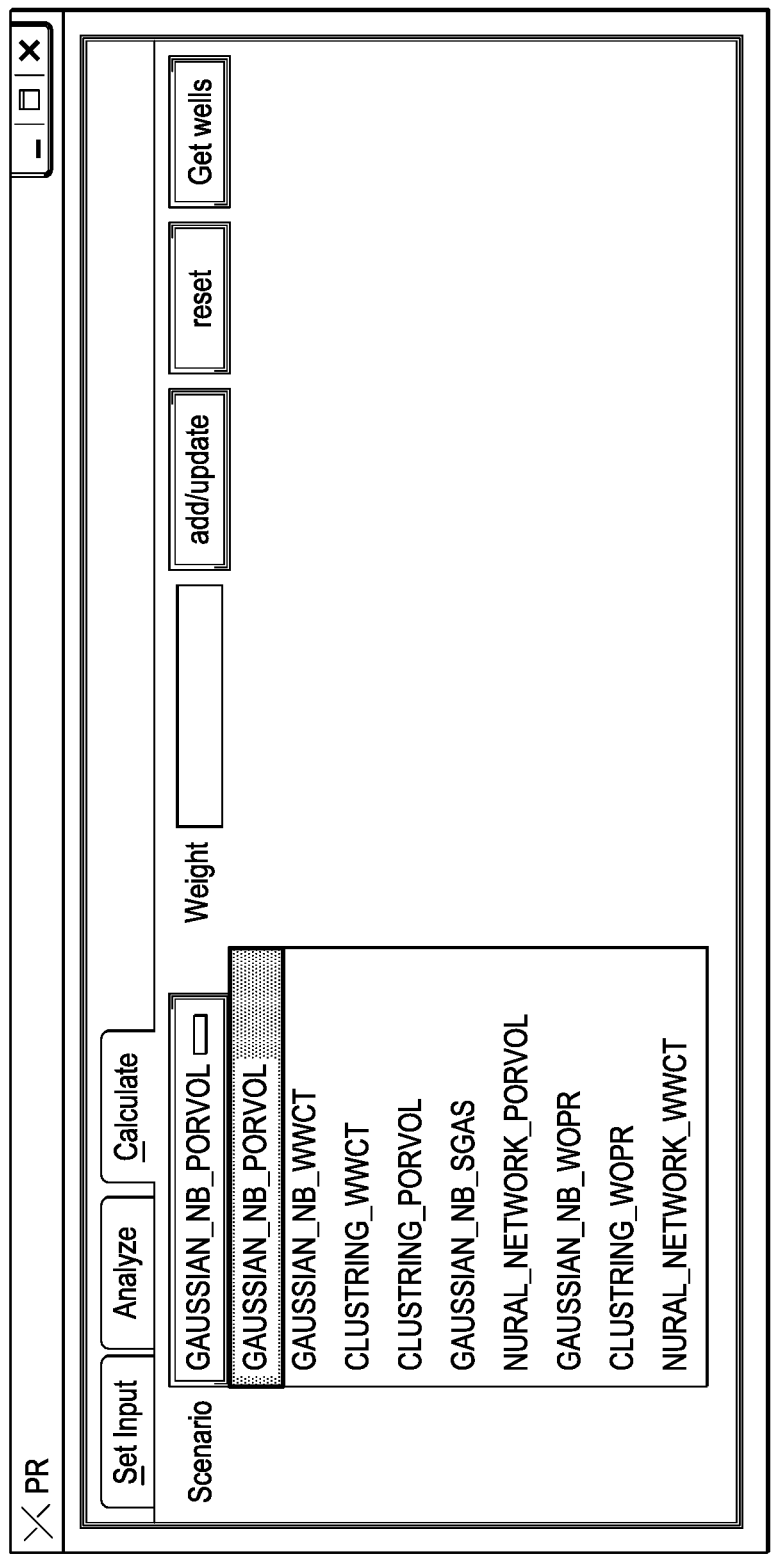
FIGS. 20 and 21 are example displays of images formed during processing according to the present invention with the computer network of FIG. 9.

FIG. 20 is a display screen image formed on user interface 106 of the data processing system D according to the present invention illustrating a list of scenarios or possible groupings of various types of training processing methodologies and reservoir properties classification properties which may be selectively employed. Examples are indicated in the table below, although it should be understood that others may also be used.

| Gaussian NB | Pore Volume |
|---|---|
| Gaussian NB | Well Water Cut |
| K-means Clustering | Well Water Cut |
| K-means Clustering | Pore Volume |
| Gaussian NB | Gas Saturation |
| Neural Network | Pore Volume |
| Gaussian NB | Well Oil Production Rate |
| K-means Clustering | Well Oil Production Rate |
| Neural Network | Well Water Cut |

Figure 21:
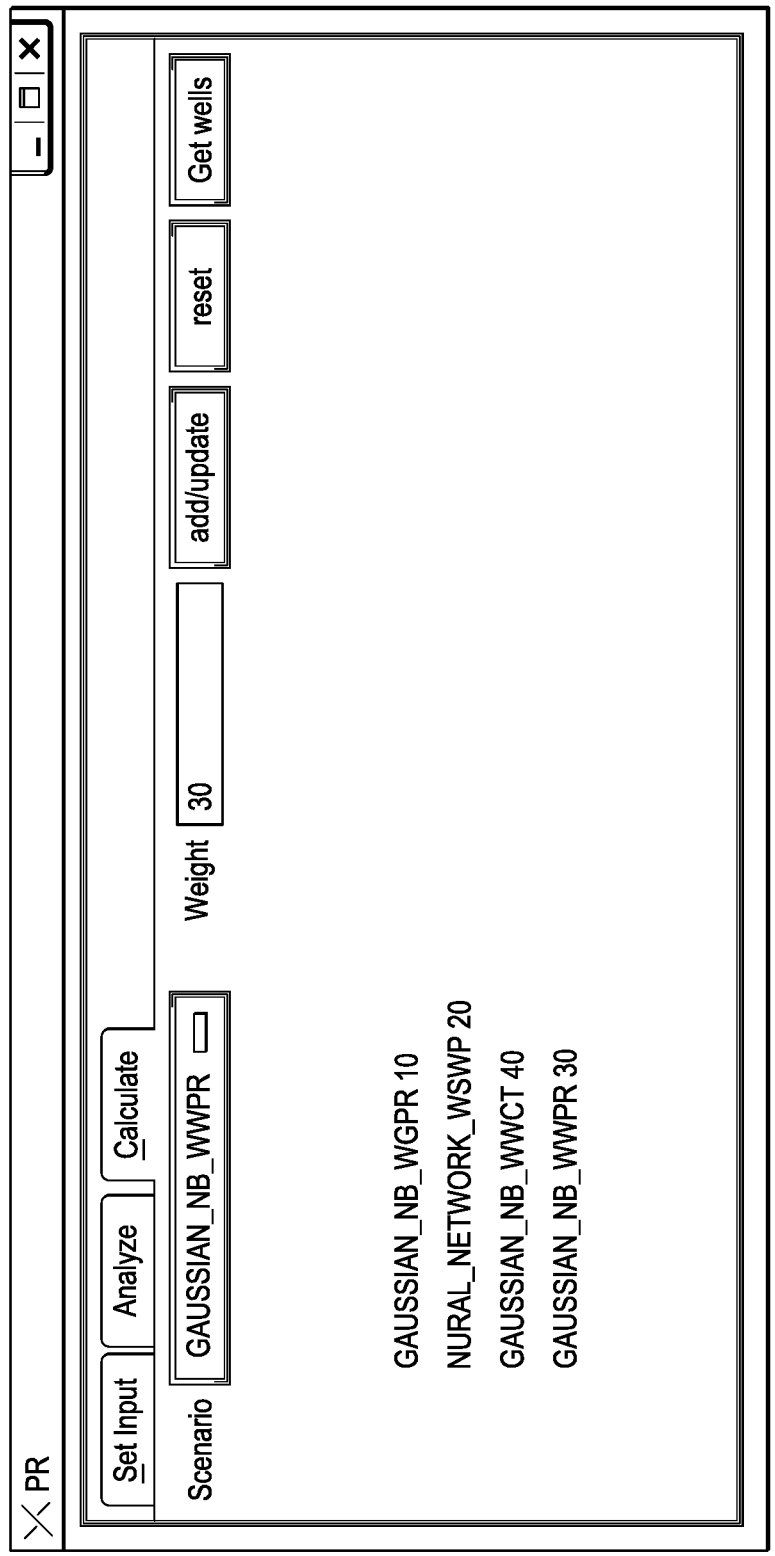

FIG. 21 is an example display screen image of user interface 106 for a report of classification scenarios such as indicated in FIG. 21 chosen with a specified weighting percentage to be applied during classification. Again, these are examples and it should be understood that others may also be used. The following table is an example report formed according to the present invention and made available with user interface 106 to indicate whether a specific proposed well is to be categorized as GOOD.

| Well | Good % |
|---|---|
| 15 | 20 |
| 26 | 20 |
| 02 | 60 |
| 05 | 100 |
| 06 | 60 |
| 08 | 90 |
| 09 | 60 |
| 12 | 20 |
| 13 | 20 |
| 43 | 20 |

With the present invention, it has been found from case studies that perforation interval, completion type, and how far or close the perforations are to the free water level or gas cap are unique features that can have a pronounced impact on oil well performance signature.

Several case studies were conducted on existing wells using the methodology of the present invention. The results such as FIGS. 12, 15, 16 and 18 show that the methodology of the present invention efficiently classifies well performance and provides prediction of optimized well locations.

The invention has been sufficiently described so that a person with average knowledge in the matter may reproduce and obtain the results mentioned in the invention herein. Nonetheless, any skilled person in the field of the invention herein, may carry out modifications not described herein, to apply these modifications to a determined structure, or in the manufacturing process of the same, requires the claimed matter in the following claims; such structures shall be covered within the scope of the invention.

It should be noted and understood that there can be improvements and modifications made to the present invention described in detail above without departing from the spirit or scope of the invention as set forth in the accompanying claims.

What is claimed is:

1. A method of forming a proposed well in a hydrocarbon reservoir, the method comprising the steps of:
displaying, by a data processing system, a model selection interface that comprises:
a reference performance property selection input to enable user selection of a reference property from a plurality of reference properties;
a reference performance property value selection input to enable user selection of a value of the reference performance property selected;
a well selection input to enable user selection of a well to be classified;
an algorithm selection input to enable user selection of one of the following algorithms for classifying the well to be classified:
clustering algorithm;
Gaussian algorithm;
neural network algorithm; and
dynamic time warping algorithm;
receiving, by the data processing system by way of the reference performance property selection input, selection of the reference property;
receiving, by the data processing system by way of the reference performance property value selection input, the value of the reference performance property selected, the value of the reference performance property selected defining a threshold for the reference performance property selected;

receiving, by the data processing system by way of the well selection input, selection of the well to be classified;

receiving, by the data processing system by way of the algorithm selection input, selection of one of clustering algorithm, Gaussian algorithm, neural network algorithm, or dynamic time warping algorithm;

receiving, by the data processing system, user specified input well parameters for the proposed well, the user specified input well parameters comprising perforation intervals, well completion type, and a specified distance between perforations of the proposed well and a free water level or a gas cap of the proposed well;

determining, by the data processing system based on application of the algorithm selected, the user specified input well parameters for the proposed well, the reference performance property, and the value of the reference performance property selected, a verified classification model for the proposed well, the determining of the verified classification model for the proposed well comprising estimating a performance property for the well based on the user specified input well parameters, and determining that the performance property estimated satisfies the threshold for the reference performance property selected; and developing, responsive to determining the verified classification model for the proposed well, the proposed well in the hydrocarbon reservoir.

2. The method of claim 1, wherein the determining of the verified classification model for the proposed well comprises artificial neural network processing, responsive to selection of the neural network algorithm.

3. The method of claim 1, wherein the determining of the verified classification model for the proposed well comprises k-means clustering processing, responsive to selection of the clustering algorithm.

4. The method of claim 1, wherein the determining of the verified classification model for the proposed well comprises Gaussian naïve Bayes processing, responsive to selection of the Gaussian algorithm.

5. The method of claim 1, wherein the determining of the verified classification model for the proposed well comprises dynamic time warping supervised learning processing, responsive to selection of the dynamic time warping algorithm.

6. The method of claim 1 further including the steps of adjusting the user specified input well parameters of the proposed well and forming a second verified classification model of performance of the proposed well based on the adjusted user specified input well parameters.

7. A data processing system for forming a proposed well in a hydrocarbon reservoir, the data processing system including a processor and instructions stored on a non-transitory computer readable storage medium, wherein the processor configured to execute the instructions to cause the following steps:

displaying, by a data processing system, a model selection interface that comprises:

a reference performance property selection input to enable user selection of a reference property from a plurality of reference performance properties;

a reference performance property value selection input to enable user selection of a value of the reference performance property selected;

a well selection input to enable user selection of a well to be classified;

an algorithm selection input to enable user selection of one of the following algorithms for classifying the well to be classified:
clustering algorithm;
Gaussian algorithm;
neural network algorithm; and
dynamic time warping algorithm;

receiving, by the data processing system by way of the reference performance property selection input, selection of the reference property;

receiving, by the data processing system by way of the reference performance property value selection input, the value of the reference performance property selected, the value of the reference performance property selected defining a threshold for the reference performance property selected;

receiving, by the data processing system by way of the well selection input, selection of the well to be classified;

receiving, by the data processing system by way of the algorithm selection input, selection of one of clustering algorithm, Gaussian algorithm, neural network algorithm, or dynamic time warping algorithm;

receiving, by the data processing system, user specified input well parameters for the proposed well, the input parameters comprising perforation intervals, completion type, and a specified distance between perforations of the proposed well and a free water level or a gas cap of the proposed well;

determining, by the data processing system based on application of the algorithm selected, the user specified input well parameters for the proposed well, the reference performance property, and the value of the reference performance property selected, a verified classification model for the proposed well, the determining of the verified classification model for the proposed well comprising estimating a performance property for the well based on the user specified input well parameters, and determining that the performance property estimated satisfies the threshold for the reference performance property selected; and developing, responsive to determining the verified classification model for the proposed well, the proposed well in the hydrocarbon reservoir.

8. The data processing system of claim 7, wherein the determining of the verified classification model for the proposed well comprises artificial neural network processing, responsive to selection of the neural network algorithm.

9. The data processing system of claim 7, wherein the determining of the verified classification model for the proposed well comprises k-means clustering processing, responsive to selection of the clustering algorithm.

10. The data processing system of claim 7, wherein the determining of the verified classification model for the proposed well comprises Gaussian naïve Bayes processing, responsive to selection of the Gaussian algorithm.

11. The data processing system of claim 7, wherein the determining of the verified classification model for the proposed well comprises dynamic time warping supervised learning processing, responsive to selection of the dynamic time warping algorithm.

12. The data processing system of claim 7, further including the steps of adjusting the user specified input well parameters of the proposed well and forming a second verified classification model of performance of the proposed well based on the adjusted user specified well input parameters.

13. A data storage device comprising a non-transitory computer readable medium storing computer operable instructions that are executable to cause the following steps for forming a proposed well in a hydrocarbon reservoir:
displaying, by a data processing system, a model selection interface that comprises:
a reference performance property selection input to enable user selection of a reference property from a plurality of reference properties;
a reference performance property value selection input to enable user selection of a value of the reference performance property selected;
a well selection input to enable user selection of a well to be classified;
an algorithm selection input to enable user selection of one of the following algorithms for classifying the well to be classified:
clustering algorithm;
Gaussian algorithm;
neural network algorithm; and
dynamic time warping algorithm;
receiving, by the data processing system by way of the reference performance property selection input, selection of the reference property;
receiving, by the data processing system by way of the reference performance property value selection input, the value of the reference performance property selected, the value of the reference performance property selected defining a threshold for the reference performance property selected;
receiving, by the data processing system by way of the well selection input, selection of the well to be classified;
receiving, by the data processing system by way of the algorithm selection input, selection of one of clustering algorithm, Gaussian algorithm, neural network algorithm, or dynamic time warping algorithm;
receiving, by the data processing system, the user specified input well parameters for the proposed well, the input parameters comprising perforation intervals, completion type, and a specified distance between perforations of the proposed well and a free water level or a gas cap of the proposed well;
determining, by the data processing system based on application of the algorithm selected, the user specified input well parameters for the proposed well, the reference performance property, and the value of the reference performance property selected, a verified classification model for the proposed well, the determining of the verified classification model for the proposed well comprising estimating a performance property for the well based on the user specified input well parameters, and determining that the performance property estimated satisfies the threshold for the reference performance property selected; and
developing, responsive to determining the verified classification model for the proposed well, the proposed well in the hydrocarbon reservoir.

14. The data storage device of claim 13, wherein the determining of the verified classification model for the proposed well comprises artificial neural network processing, responsive to selection of the neural network algorithm.

15. The data storage device of claim 13, wherein the determining of the verified classification model for the proposed well comprises k-means clustering processing, responsive to selection of the clustering algorithm.

16. The data storage device of claim 13, wherein the determining of the verified classification model for the proposed well comprises Gaussian naïve Bayes processing, responsive to selection of the Gaussian algorithm.

17. The data storage device of claim 13, wherein the determining of the verified classification model for the proposed well comprises dynamic time warping supervised learning processing, responsive to selection of the dynamic time warping algorithm.

18. The data storage device of claim 13, the steps further including adjusting the user specified input well parameters of the proposed well and forming a second verified classification model of performance of the proposed well based on the adjusted user specified well input parameters.

* * * * *